United States Patent [19]

Vinal

[11] 4,163,986

[45] Aug. 7, 1979

[54] TWIN CHANNEL LORENTZ COUPLED DEPLETION WIDTH MODULATION EFFECT MAGNETIC FIELD SENSOR

[75] Inventor: Albert W. Vinal, Cary, N.C.

[73] Assignee: International Business Machines Corporation, Armonk, N.Y.

[21] Appl. No.: 902,327

[22] Filed: May 3, 1978

[51] Int. Cl.² .................. H01L 27/22; H01L 29/82; H01L 29/96
[52] U.S. Cl. .......................... 357/27; 357/23; 307/309
[58] Field of Search .................. 357/23, 27; 307/309

[56] References Cited

U.S. PATENT DOCUMENTS

| | | | |
|---|---|---|---|
| 3,678,302 | 7/1972 | Kasano et al. | 357/27 |
| 3,683,127 | 8/1972 | Hori | 357/27 |
| 3,836,793 | 9/1974 | Joshi | 357/27 |
| 3,994,010 | 11/1976 | Geske | 357/27 |
| 3,997,909 | 12/1976 | Vinal | 357/27 |
| 4,028,718 | 6/1977 | Migitaka | 357/27 |
| 4,048,648 | 9/1977 | Vinal | 357/27 |
| 4,129,880 | 12/1978 | Vinal | 357/27 |
| 4,141,026 | 2/1979 | Bate et al. | 357/27 |

OTHER PUBLICATIONS

IBM Technical Disclosure Bulletin; Hall Effect Device Feedback Circuit, vol. 13, No. 8, Jan. 1971, p. 2448.

*Primary Examiner*—Andrew J. James
*Attorney, Agent, or Firm*—Edward H. Duffield

[57] ABSTRACT

A high sensitivity, low noise, broad bandwidth, twin channel conduction Lorentz channel coupled semiconductive field sensor device is described. The conductive channels are configured to create exceptionally narrow, undepleted conduction zones of approximately filamentary form. The filamentary conductive channels so formed are provided with a common source at one end of each channel and a separate drain at the other end thereof. The independent drains are spaced apart by a narrow area of semiconductive material. Magnetic fields may be utilized to create a Lorentz voltage in a region between the two conductive channels to vary the amount of current received at the two drains by utilizing the depletion width modulation effects of the Lorentz voltage upon the boundaries defining the conductive channel portions. Modulation of the depletion zone widths and depths along the channel sides effectively move the streams of carriers and the conductive channel areas to conduct more current to one drain more than another. This develops a differential drain current balance which can be utilized to provide an output signal. Width and length criteria for defining the filamentary channel structures are described for the ultimate desired configuration and size which are to be obtained. As noted, operation of the device is based upon Lorentz voltage modulation of the width and depth of the depletion zone boundaries defining the conductive channel. The Lorentz voltage is created in an area of semiconductive material coupling the two filamentary channels. An increased signal output is obtained by reducing the width of the filamentary channels to eliminate excess carriers normally found in wide channel devices and, further, by making the depletion zones as large a portion of the total channel widths as can be obtained.

11 Claims, 24 Drawing Figures $V_{DS} \leq$ IMPACT IONIZATION VOLTAGE $V_{DSI}$

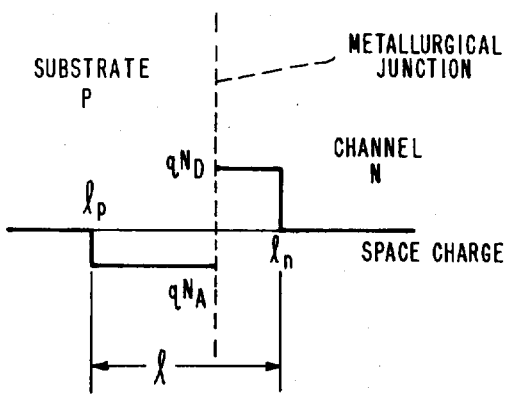

FIG. 10A

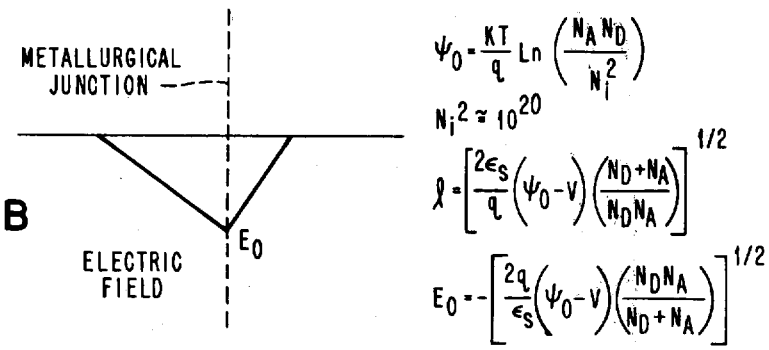

FIG. 10B $$\psi_0 = \frac{KT}{q} \operatorname{Ln}\left(\frac{N_A N_D}{N_i^2}\right)$$

$$N_i^2 \approx 10^{20}$$

$$\ell = \left[\frac{2\epsilon_s}{q}(\psi_0 - V)\left(\frac{N_D + N_A}{N_D N_A}\right)\right]^{1/2}$$

$$E_0 = -\left[\frac{2q}{\epsilon_s}(\psi_0 - V)\left(\frac{N_D N_A}{N_D + N_A}\right)\right]^{1/2}$$

FIG. 10C

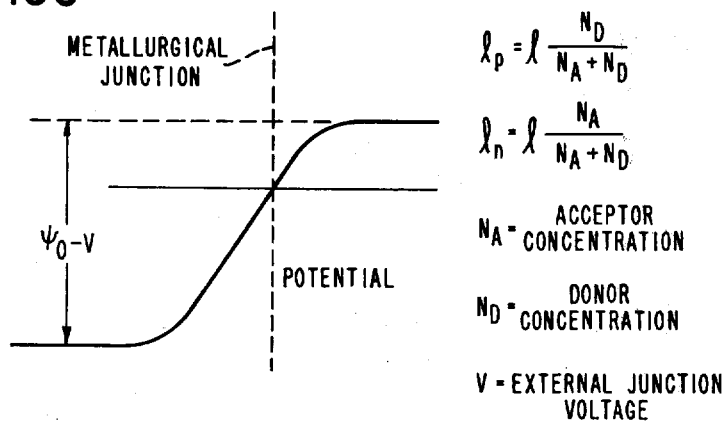

$$\ell_p = \ell \frac{N_D}{N_A + N_D}$$

$$\ell_n = \ell \frac{N_A}{N_A + N_D}$$

$N_A$ = ACCEPTOR CONCENTRATION $N_D$ = DONOR CONCENTRATION

V = EXTERNAL JUNCTION VOLTAGE

TWIN CHANNEL LORENTZ COUPLED DEPLETION WIDTH MODULATION EFFECT MAGNETIC FIELD SENSOR

DESCRIPTION

This invention relates to field sensors in general and to semiconductive magnetic sensors of the general field effect transistor type in particular.

RELATED APPLICATIONS

This invention is related to my previous work on single channel devices of the preferred sort as described in my copending applications Ser. Nos. 812,298 now and U.S. Pat. No. 4,129,880 and 701,339 and now U.S. Pat. No. 4,048,648.

BACKGROUND ART

A great amount of effort has been expended in developing field effect transistor magnetic sensor devices. The general operation of the prior art devices has consisted of utilizing what was previously understood to be Lorentz deflection of the carriers flowing between the source and one or more drains in a field effect transistor. This was used to create an imbalance in the drain currents thereof to give a differential signal output at the drains. See, for example, IBM Technical Disclosure Bulletin, Vol. 13, No. 12, May 1971, page 3633, or, for example, the UK Pat. No. 1,243,178 in which is shown an FET magnetic sensor having two or three drains and a source at opposite ends, respectively, of a field effect transistor channel. As will be understood by those of skill in the art, suitable gate and insulating oxide layers are also formed in such devices to control the flow of current in the channel.

In the aforementioned UK patent, by application of suitable voltage to the gate an inversion layer acting as a conductive channel is established. The effective conducting channel thus formed extends between the source and two or three drains. The source is connected to ground and the drains are connected to a supply voltage through resistive loads which may be of equal value. As is well known in the art, when the device is operated with appropriate voltages on the source, drain and gate, a current will flow between the source and drains. It has been thought that this current stream could be deflected by a Lorentz force produced by a magnetic field intersecting the path of the charge carriers. This is the well-known state of the art and, as stated in this UK patent, it is believed that the Lorentz deflection force will cause charge to "build up" on one side of the channel and to be depleted on the other side until the electric field produced by the displacement of charge applies a force on the charge carriers which is equal and opposite to that due to the magnetic field.

This classical teaching of a "charge buildup" occurring in the channel to oppose deflection of the charge carriers has resulted in the use of relatively wide channels in the field effect transistor structures of this type. This was to provide room to deflect the charge carriers without interaction or "charge build-up" occurring to a significant degree. Of course, a wider channel will carry proportionately greater currents than will narrower channels. In the differential mode, only a small number of the current carriers (those near the center of the channel) are actually deflected in their path to strike one drain instead of another. The majority of carriers in the wide channel device will, therefore, add to the drain current at the output drains in a manner which is not affected by Lorentz deflection. This, in turn, means that noise voltages produced in the load resistors will be greater than would otherwise be the case with a narrow channel device. Furthermore, since only a relatively small proportion of the carriers in the channel are capable of being deflected to produce a signal, the signal levels produced relative to the noise levels produced will be relatively smaller than might be desired. Also, because of the greater relative width of a channel of this type, the resolution of the device, i.e., the narrowest band of magnetic flux which can be utilized to deflect the carriers that produce an output signal will be reduced.

The use of wide channels, i.e., those in which the channel width is greater than the width of the smallest drain or source or spacing of elements, indicates that the width of the depletion zones along the channel boundaries was either ignored or unrecognized in the prior art. In either event, the prior art depletion zones in such wide channel devices constitute an insignificant portion of the prior art channel width. In contrast, in the present invention, the widths of the depletion zones within the channel constitute a significant portion of the total channel width because the channel widths are so small that the depletion zones form a relatively greater portion of the total width.

Related prior art of a slightly different sort uses bipolar (P-N) or junction devices in which the source and one or more drains are of dissimilar conductivity material embedded in a substrate of semiconductive material. See, for example, U.S. Pat. Nos. 3,714,559 and 3,829,883 or 3,167,663 and 3,731,123. As noted in these patents, a major problem associated with magnetic field sensors of the FET type is the difficulty of obtaining high sensitivity with sufficiently large output signals under acceptable signal-to-noise ratios in sufficient bandwidth conditions.

In the first mentioned U.S. Pat. Nos. 3,714,559 and 3,829,883, a multi drain FET magnetic field detector is shown which is operated in a mode in which the gate is biased to less than the transistor threshold and the first drain is biased to produce avalanche breakdown of the junction with the substrate while the second and third drains are biased to a voltage below that required for avalanche breakdowns of their junctions. In this mode of operation, the field effect transistor channel has not effectively been caused to conduct. Therefore, a field effect transistor structure is not essential for operation of this device since it does not operate as a field effect transistor in this mode and no "channel" exists. An alternative embodiment is shown in these patents in which at least one of the drains is of the same conductivity type as the substrate but more highly doped. This device is operated to produce a current between the source diffusion and the junction so that the device apparently operates more as a diode. These devices claim to have high sensitivity, relatively high signal output and good signal-to-noise ratios but are, as stated therein, not operated as field effect transistors. It is believed that they operate to accelerate holes diverted by a magnetic field and that these minority carriers in a deflection mode have improved sensitivity. The difficulties of avalanche breakdown control and generating sufficient hole-electron pairs to enable a hole current flow from the source to the drain may prove undesirable in certain applications. It is believed to be more desirable to use the majority carrier channel current, if possible, in field effect transistor structures operated as transistors.

The aforementioned U.S. Pat. Nos. 3,167,663 and 3,731,123 show other magnetic field detecting devices of the P-N junction type (bipolar). These devices operate essentially as diodes in which current flow can be changed or directed by the application of external magnetic fields. These devices are thought to be operated in the region of high current flow in which injected carriers are deflected by Lorentz deflection to result in lateral displacement of the carrier stream and a differential output signal between two or more P-N junction drains. These devices have intrinsically higher currents and, while they may be sensitive to magnetic fields, they are also more subject to noise current phenomena.

A similar type of device to the previously discussed patents is shown in U.S. Pat. No. 3,593,045 in which a beam of injected electrons created at a P-N junction in a semiconductor device is supposed to be deflected to one or more targets by electric or magnetic fields. This device is not operated as a field effect transistor, however. Unfortunately, it requires provision of relatively high biasing and driving voltages, typically on the order of 200 volts as described in the patent, which make it unsuited for application to field effect integrated circuits.

Another area in which the prior art has provided some development and investigation is in the field effect Hall devices such as that illustrated in U.S. Pat. No. 3,448,353, for example. These devices, of which U.S. Pat. No. 3,448,353 is typical, do not directly utilize the deflection of carriers in a field effect device but utilize the offset voltage produced by Lorentz deflection of equipotential lines of the carriers transverse to the input and output connections. The Hall devices are usually characterized as well by relatively low length-to-width ratios (under approximately three to one) and are best operated with equal width and length as is now well known in the art. The output signal in Hall devices, as is also well known, is proportional to carrier velocity and not to the number of carriers. Since these are not field effect transistor structures operated in the mode in which a beam of carriers is deflected and a differential output signal at the drains obtained, only a voltage output from the Hall output probes on either side of the channel can be used. It is preferable to have an actual signal current obtained at one or more of the drains as is the case with the aforementioned differential deflection field effect structure such as described in the aforenoted U.K. patent.

Still other related prior art is in the field of charge coupled devices which control the state of current flow in field effect transistor channels of relatively greater width such as that shown in U.S. Pat. No. 3,714,523 or in the IBM Technical Disclosure Bulletin, Volume 14, No. 11, April 1972, page 3420. The patented device provides high sensitivity for magnetic field detection. A differential control of the gate electrodes coupled back from the drains may be utilized to provide positive feedback to create extremely sensitive devices as described in the patent. Charge coupled devices of this type also provide an amplification factor and may be utilized to provide higher output signals. However, due to the relatively greater width of such devices and greater current flows, higher noise output voltages may be expected. Such noise is amplified by the feedback mechanism used, as well. Of course, the great width of these devices also indicates that the depletion zones on either side of the channel are an insignificant portion of the total channel width.

OBJECTS

In view of the aforementioned difficulties in the prior art, it is an object of this invention to provide an improved high sensitivity channel conduction magnetic field sensor which exhibits relatively low channel currents and very low noise voltage outputs to achieve high signal-to-noise ratios at adequate signal bandwidth and output voltage levels.

It is another object of the present invention to provide an improved channel conduction sensor structure having two filamentary channels characterized by relatively high length-to-width ratios in which narrow and confined conduction zones for charge carriers may be maximally deflected to the left or right by a depletion width modulation mechanism driven by a Lorentz voltage generated in a coupling channel region lying between the two filamentary channels and electrically connecting them.

A further object of this invention is to provide an improved channel conduction sensor in which there exist relatively wide depletion zones which are a relatively large proportion of the total filamentary channel widths.

SUMMARY

The foregoing and other objects of the invention are met by constructing, in either the enhancement mode or depletion mode of operation, at least two relatively long, narrow, spaced apart conduction channels in which each conductive channel has relatively wide depletion regions along the sides thereof in proportion to the undepleted area within the channel. As used herein, such a device is called a Lorentz coupled Vinhall twin device to distinguish it from other channel conduction devices that will be discussed.

The width and length parameters utilized to define an individual Vinhall device in general also describe the filamentary nature of the conductive channels. Each conductive channel has a minimum width of at least twice the width of the depletion zone along either side of the channel. Such a width corresponds to a Vinhall width of zero. The length of such a device must be great enough to avoid shorting or breakdown in the conductive channel between its source and drain.

The resulting range of length-to-width ratios which may be defined corresponds to the creation of conductive channels for field sensitive devices which are approximately one to two orders of magnitude ($10^{-1}$ to $10^{-2}$) narrower than those previously contemplated. This factor leads to a consideration of the mechanism by which deflection of the charge carrier channels, as defined by the depletion zone boundaries, may occur and to the sources of noise in such sensors.

When the operative mechanism and the sources of noise are understood properly, it is possible to construct devices having sensitivity and signal-to-noise ratios much greater than the prior art. Signal-to-noise ratios on the order of 50 to 1 to over 300 to 1 have actually been achieved using the present invention with normally experienced magnetic fields of 350 Gauss.

BRIEF DESCRIPTION OF THE DRAWINGS

The present invention will now be described with reference to illustrative drawings and charts which describe various aspects of the preferred embodiments thereof; a detailed analysis of the modes of operation and some sources of noise will also be given with reference to the figures as follows:

FIGS. 10A through 10C illustrate, respectively, the space charge region, the electric field and the potential, respectively, that exist across the P-N junction formed along each edge of the conductive channels in devices of the general type according to the invention.

DETAILED SPECIFICATION

Figure 1:
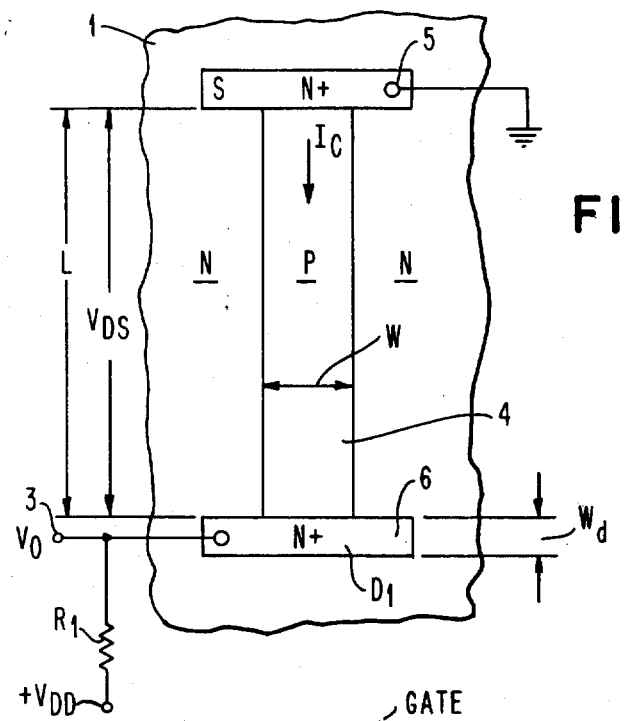
FIG. 1 illustrates a top or plan view of a schematic form of a single channel filamentary conduction device created in, or even beneath the surface of, a semiconductive slab of material as described in my copending application Ser. No. 812,298 now Pat. No. 4,129,880.

The theory of operation of the invention and the characteristics which distinguish it from similar devices will be described. At the outset, however, it is necessary to make several observations. Firstly, for the best sensitivity, the Lorentz coupled twin channel Vinhall device as I have herein defined it, is easily distinguished from other similar devices. The Vinhall device is characterized by having two conductive channels which, contrary to the teachings in the prior art, are made as narrow as is physically attainable. The present range and resolution of available photolithographic technology make possible the construction of Vinhall devices having conductive channels with widths on the order of one tenth of a mil (0.0001 inches or 2.5 microns). However, it is most desired to make the channels narrower still.

The concept of each independent Vinhall channel width is herein defined as the total channel width minus twice the depletion region width within the channel. The minimum Vinhall width of each channel would be at least a few hundred Angstrom units in order to support at least some current flow. The narrowest limit of resolution for the manufacturing processes currently available does not permit the construction of such narrow conductive channels. However, the narrowest channels which may be formed operate adequately. The best sensitivity and improved performance will result when the narrower channels as described are achieved.

The present processes for forming semiconductive substrate channels yield total physical channel widths of approximately one tenth of a mil (0.0001 inches, 2.5 microns or 2.54 times $10^{+4}$Å). Therefore, the teaching of the present specification, while hindered in total realization by the available technology for the construction of the conductive channels, should not be construed to be limited thereby. What is intended is that the narrowest attainable channels down to or approaching the minimum width which has been defined for operability will constitute the preferred embodiment.

Secondly, the Lorentz coupled twin Vinhall device as characterized herein is a distinct type of charge carrier stream deflection detector. The device operates as a magnetic field sensor in an entirely different mode from the so-called Hall devices. One distinction is that the present device operates by deflecting the actual depletion zone boundaries which contain the streams of charge carriers and detects the effects thereof at two or more output drains.

Another distinction is that the carrier stream boundaries and the independent channel currents in the present device are varied by modulating the channel depletion zone widths for either constant velocity or velocity gradient carrier streams. The Hall device, in contrast to the present device, does not produce a current output signal and, indeed, no current can be drawn at the output terminals of a Hall device without interfering greatly with its operation.

As will appear herein, the Hall device output depends upon the existence of a carrier velocity gradient within its conductive channel. No signal of any significance will be produced without such a gradient. Also, the Hall device relies on the velocity gradient and not upon the number of carriers. The operable Hall device may be characterized as requiring a velocity gradient within the channel to rotate equipotential voltage lines within the channel to induce an offset voltage output of the Hall probes. Any attempt to draw a significant current from the Hall output probe or probes will result in deteriorating the operation of the device by distorting the deflection pattern of the equipotential lines.

The Lorentz coupled twin Vinhall device described herein quite effectively operates without any velocity gradient and is dependent instead upon the magnitude of velocity and upon the number of carriers moving within each channel and on the carrier velocity alone in the Lorentz coupling channel.

Thirdly, and more importantly, the operation of a Lorentz coupled twin Vinhall device will be shown to be dependent upon the thickness of each channel, the Vinhall width of each channel, and the density per unit volume of the charge carriers existing in the substrate and in each conduction channel. This is in distinct contrast to the teachings of the prior art and understanding of the prior physical principles which tend to indicate that the widths of channel conduction devices should be increased rather than decreased to avoid charge crowding effects. As will be presently described, such teachings have been found to be in distinct error due to a lack of understanding of the charge crowding mechanism and an apparent ignorance of the true operative mechanism of the devices.

What will be described is felt to be a correct and fundamental statement of the nature of the mechanism for operating magnetic sensors of this general type. It will be shown that better operation is provided by narrower channels instead of wider channels. Such a teaching is directly away from the knowledge and practice of the prior art. It makes possible the unexpected discovery that narrow conductive channels are, in fact, the most desirable ones for the Vinhall devices.

THEORY OF INVENTION

Figure 6:
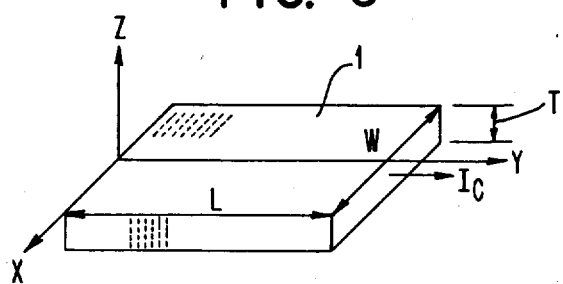
FIG. 6 illustrates, in schematic form, a diagram for calculating channel current for conduction in either channel and in either of the modes or embodiments of the present invention.

Turning now to a discussion of the theory of operation of a Lorentz coupled twin Vinhall channel magnetic sensor, reference will be had to FIG. 6 initially in which is shown a typical slab of semiconductive material 1. Slab 1 may be any semiconductive material such as silicon, germanium, gallium arsenide or a variety of other related elements and compounds having intrinsic semiconductive properties well known in the art. In slab 1 are shown a plurality of charge carriers 2 disbursed in equal spacing along the x, y and z axes. As shown in FIG. 6, width W is measured along the x axis, thickness T along the z axis, and length L along the y axis. There is no particular significance as to which axes are chosen for the representation and the nomenclature is chosen only for the purpose of discussion.

An analysis of a Vinhall structure requires the derivation of equations which define the channel currents, the sensor output functions and the signal-to-noise ratios for such a device.

The discussion will begin from an understanding of the first principles of physics. It is desired to define the existing dose density of electrons or carriers within the slab. In FIG. 6, the slab 1 represents a small segment of a semiconductive channel either implanted in or induced into a semiconductive substrate by means well known in the art. The dose density of charge carriers will be defined in terms of volumetric density. Proceeding then, let $N_x$ = The number of charged carriers or ions in the slab in the x direction.
$N_y$ = The number of charged carriers or ions in the slab in the y direction.
$N_z$ = The number of charged carriers or ions in the slab in the z direction.

Now it may be assumed that there exists an average spacing between charge carriers, electrons or ions in any direction in slab 1 equal to a distance defined as d.

The total number of charge carriers, electrons, or ions, as they may be variously described, which will exist within the slab 1 in FIG. 6, which is understood to be a small portion of the conductive channel in a given substrate, will be given by:

$$N_{total} = N_x N_y N_z = (WLT)/d^3 \qquad \text{Eq. (1)}$$

Now $1/d^3$ can be defined as equal to $N_D$ the donor concentration which is the number of ions, charge carriers or electrons per unit volume within slab 1 existing in the conductive channel in a substrate. Therefore, Eq. (1) may be rewritten as follows:

$$N_{total} = N_D WLT \qquad \text{Eq. (2)}$$

The dose or fluence of electrons, charge carriers or ions in a segment of the x-y plane in FIG. 6 in a layer of thickness T will be defined as D. Therefore:

$$D = N_{total}/WL = N_D T \qquad \text{Eq. (3)}$$

Therefore, solving Eq. (3) for $N_D$ $$N_D = D/T \qquad \text{Eq. (4)}$$

The channel current $I_C$ through the slab 1 in FIG. 6 will be developed next.

A single electron diameter wide beam of electrical current is defined as the change in charge per unit time $dq/dt$. This is equal to current taken in one of the axes in FIG. 6 and it will be assumed, for purposes of explanation, that the beam current $I_B$ will be along the y axis in FIG. 6. Therefore, the beam current $I_B$ can be defined as follows:

$$I_B = \frac{dq}{dt} = \frac{dq}{dy} \frac{dy}{dt} \qquad \text{Eq. (5)}$$

Stated otherwise, the beam current $I_B$ is equal to the unit charge of an electron q times the velocity $\underline{V}$ of the charge carrier divided by the spacing d between successive charge carriers, i.e.:

$$\frac{dq}{dy} = q/d \text{ and } dy/dt = V \qquad \text{Eq. (6)}$$

Therefore:

$$I_B = \frac{q}{d} V \qquad \text{Eq. (7)}$$

where $\underline{V}$ is the average carrier velocity along the y axis in FIG. 6 and d is the average spacing between carriers forming the electron beam directed along the y axis in FIG. 6.

The Eq. (7) above is the effective current of a single electron stream or beam of carriers moving in the y direction. To extrapolate the single electron beam of carriers into a sheet of current across the entire width of the slab in the x axis shown in FIG. 6, a definition of the sheet current $I_S$ of a single layer of electrons across such a surface would be as follows:

$$I_S = I_B N_X \text{ or}$$
$$I_S = I_B \frac{W}{d} = \frac{q}{d} \frac{W}{d} \underline{V} \qquad \text{Eq. (8)}$$

This is to say that a sheet of current $I_S$ moving in the y direction is equal to the beam current $I_B$ multiplied by the number of electrons distributed along the x axis and moving in the y direction in that sheet. This is equal to W divided by the electron spacing d.

The total channel current moving in a given direction in FIG. 6 will be defined as $I_C$ and will be equal to the sheet current $I_S$ multiplied by the number of electrons or carriers distributed on the z axis in a thickness T to give the total volumetric current. For channel current moving along the y axis in FIG. 6, $I_C = N_Z I_S$. This in turn may be defined as $$\frac{T}{d} \frac{q}{d} \frac{W}{d} \underline{V}$$

or:

$$I_C = N_D T W q \underline{V} \qquad \text{Eq. (9)}$$

where T is the thickness of the channel on the z axis.

Now the density of carriers in a planar cross section of thickness T was previously defined as D which is equal to the volumetric density of carriers $N_D$ times the thickness of the slab as previously shown in Eq. (3) above. Therefore, by substitution, Eq. (9) becomes:

$$I_C = D W q \underline{V} \qquad \text{Eq. (10)}$$

Stated otherwise, the total channel current is equal to the dose density of carriers multiplied by the width of the channel times the unit charge q and the velocity of the carriers $\underline{V}$.

The carrier velocity term $\underline{V}$ can be rewritten in terms of first principle physics by assuming that there exists a uniform longitudinal electrical field along the channel in the direction of carrier motion. This assumption actually creates a first order approximation to the actual existing electrical field along a channel in the direction of motion as follows: If the existing electric field is defined as $E_L$ and the mobility of carriers as $\mu$, from first principles, velocity $\underline{V}$ is defined as the product of electric field E and mobility $\mu$. The existing electrical field in a channel conduction device of the class described may be approximated where there exists a drain to source distance L. Therefore, $$E_L = \frac{V_{DS}}{L} \text{ and,} \qquad \text{Eq. (11)}$$

$$V = \mu \frac{V_{DS}}{L}$$

APPLICATION OF THEORY

Turning now to FIG. 1, the principles developed so far will be applied to a single typical Vinhall sensor channel shown in plan view as in FIG. 1 having a total channel length L, a total channel width through the area where the carrier stream is being generated of W, and having a source S and a drain $D_1$, all existing in the surface or buried beneath the surface of a substrate of semiconductive material. In FIG. 1 a typical source 5, which would be connected, for example, to ground potential, is shown at one end of a conductive channel 4 having a length and a width as described and terminated by a drain region 6 ($D_1$). The drain region 6 is connected to an output circuit through resistor $R_1$ to produce an output voltage $V_o$ relative to ground at the terminal 3. The drain 6 is connected to a drain voltage source $V_{DD}$ and the voltage between the drain 6 and the source 5, $V_{DS}$, must be held below that at which impact ionization occurs.

Figure 3A:
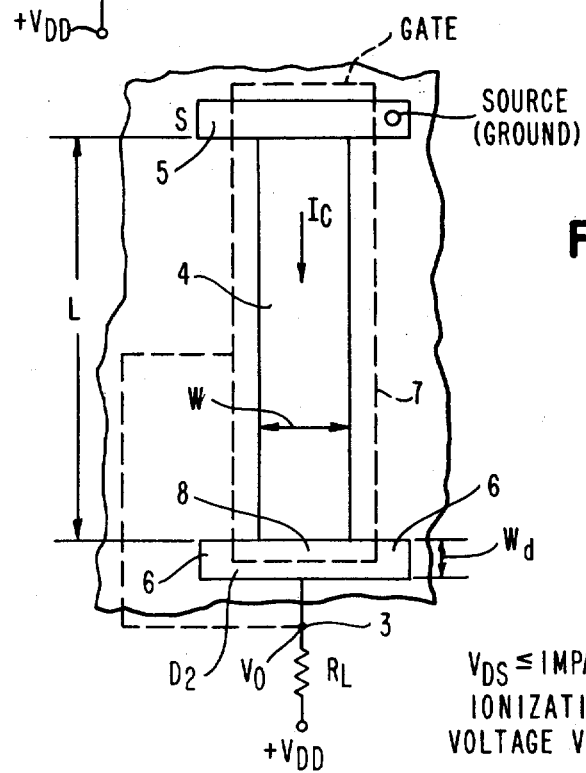
FIGS. 3A and 3B illustrate single channels of the enhancement type which may be used to implement the invention with FIG. 3A being a plan view and FIG. 3B being a longitudinal cross sectional view of FIG. 3A as indicated.

In FIG. 1, a single main channel of semiconductive material is identified as numeral 4, the source as numeral 5 and the drain as numeral 6. Two such channels are employed in the present invention, but only one is now described for simplicity. A metallic gate or electrostatic shield 7 is shown in phantom lines overlying the general area of the conductive channel 4 and separated from the substrate surface by a thin oxide region. As is well known in the art, a gate is utilized in the enhancement mode of semiconductive field effect devices to induce an effective dose of charge carriers to form a conductive channel between the source and drain or drains, respectively. In FIG. 3A for silicon technology, gate 7 would be operated, for example, with approximately a ten volt potential.

Width W, although not to scale in the drawing, represents the narrowest limit of resolution by which a semiconductive element may be formed with existing technology. The width $W_d$ of the drain 6 also is approximately the same dimension. Since it is desired to make the width of channel 4 as narrow as possible, it follows that the width of the drain regions, can be no narrower since they are all at the limit of resolution. When two such Vinhall channels are constructed side by side as will be described later, there will be a slit $W_s$ between the separating the two drains. This will create a gap 8 between the drains and should be of minimum resolution width. Stated otherwise, with reference to FIG. 4A, the gap 8 between the two drains 6 in a twin channel configuration would be forced to have a width of $W_s$ since it is the minimum width which can effectively be controlled due to the resolution of the semiconductor manufacturing processes employed. However, techniques exist for narrowing gap 8 to a slit of still smaller dimensions, as is desirable.

It should be understood that it is desired to make channel 4 as narrow as possible and to make the drains 6 equally as narrow and attach them to the narrow channels in an independent manner to leave a slit 8 of minimal width between the drains. Since the limits of resolution of the available forming processes presently employed limit the width of a channel to a width W, the spacing 8 which can be accurately controlled is initially of similar dimensions, although techniques exist as will be shown for narrowing slit 8 further.

Having described a typical embodiment of a single Vinhall channel with relation to FIG. 1 and having given some discussion of the channel current derivation for the device, we will now return to consider the current conditions and operating requirements and characteristics of such a device such as that shown in FIG. 1.

Substituting Eq. (11) into Eqs. (9) and (10) yields the following channel current expression:

$$I_C = N_D T (W/L) q \mu V_{DS} \qquad \text{Eq. (12A)}$$

or $$I_C = D(W/L) q \mu V_{DS} \qquad \text{Eq. (12B)}$$

Figure 9:
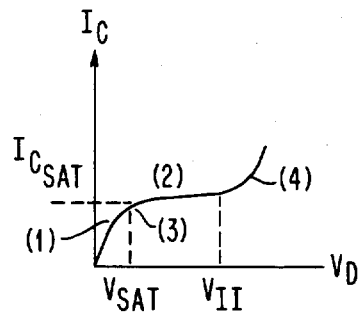
FIG. 9 illustrates a typical drain current versus voltage curve for a FET device and shows the regions of operation and the critical points thereof.

Eqs. (12A) and (12B) shown above are alternative expressions for the channel current $I_C$ in the device such as shown in FIG. 1. As is well known to those of skill in the art, devices such as shown in FIG. 1 operate with a drain current characteristic as shown in FIG. 9. This drain current graph is typical of the so-called field effect transistors in general and exhibits several characteristics, well understood, as the linear region (1), saturation region (2), and pinch-off (3) as well as impact ionization region (4). At pinch-off, although the drain-to-source voltage may be increased, the current conduction does not greatly increase until impact ionization, avalanche or other similar breakdown phenomena occur at excessively high drain-to-source voltages. The channel current at saturation or pinch-off is, therefore, given as follows:

$$I_{CSat} = N_D T(W/L) q \mu V_{Sat} \qquad \text{Eq. (13A)}$$

or, alternatively $$I_{CSat} = D(W/L) q \mu V_{Sat} \qquad \text{Eq. (13B)}$$

For drain-to-source voltages in a channel which area above pinch-off but below impact ionization, the channel current equations are as follows:

$$I_C = N_D T \left(\frac{W}{L}\right) q \mu V_{Sat} \left(\frac{L}{L - L_D}\right) \qquad \text{Eq. (14A)}$$

$$I_C = D \left(\frac{W}{L}\right) q \mu V_{Sat} \left(\frac{L}{L - L_D}\right) \qquad \text{Eq. (14B)}$$

In the equations above, L is the total length of the channel between source 5 and drains 6. As is understood by those of skill in the art, a pinch-off region can be formed in a channel conduction device and the pinch-off region will form in the vicinity of the drains creating a depleted portion of channel length $L_D$. The effective length of the undepleted portion of the channel, therefore, is shortened to $L - L_D$.

The derivation of channel current in a field effect device or in a channel conduction device for the various areas of its operation in a drain current curve as shown in FIG. 9 have previously been derived. They are shown in my copending patent application Ser. No. 701,339 wherein the $L/(L-L_D)$ terms introduced in the above equations are examined with relation to the operation of such a device. It is not necessary to reproduce that derivation here. Suffice it to say that the dependence of drain or channel current on the length of the channel divided by the total remaining undepleted length (that length extending up to the pinch-off zone) has been experimentally verified and theoretically analyzed and justified so that the equations above are an accurate representation of the operation of devices such as shown in FIG. 1.

When the conduction channel of a device such as shown in FIG. 1 is buried below the surface of a substrate, a pinch-off voltage still exists but must be arrived at by other considerations. These considerations will not be given here in detail since they may be approximated by the junction field effect device (J-FET) analysis given in *Physics of Semiconductor Devices* by S. M. Sze, page 341 et seq. I have expressed the pinch-off voltage for a J-FET in modified form and defined as $V_{D\,Sat}$ as follows:

$$V_{D\,Sat} = 3 \frac{q N_D T^2}{2 e_S} = 3 \frac{q D T}{2 e_S} \qquad \text{Eq. (15)}$$

In Eq. (15) above, $e_S$ is the dielectric constant for the semiconductive material employed. For silicon, $e_S$ is approximately equal to $1.05 \times 10^{-10}$ Farads/meter.

Substituting Eq. (15) into Eq. (14A) and Eq. (14B) above gives the following:

$$I_C = 3(N_D T)^2 q^2 T \left(\frac{W}{L}\right) \frac{\mu}{2 e_S} \left(\frac{L}{L - L_D}\right) \qquad \text{Eq. (16A)}$$

$$I_C = 3 D^2 \left(\frac{W}{L}\right) q^2 T \frac{\mu}{2 e_S} \left(\frac{L}{L - L_D}\right) \qquad \text{Eq. (16B)}$$

Having derived the foregoing expressions from the basic physical principles which characterize the flow of charge carriers in a semiconductive channel device, attention will next be focused on the development of the Lorentz coupled twin channel Vinhall theory of operation. Now as stated previously, the force motivating motion of the channel depletion boundary walls is derived from the Lorentz voltage applied to the channel walls. In simple terms, the Lorentz voltage $V_L$ (FIG. 2) is the product of carrier velocity $\underline{V}$, magnetic field B and the distance between the sides of the channel walls, defined before as the Vinhall width $W_v$.

$$V_L = \underline{V} B W_v \qquad \text{Eq. (17)}$$

In the pinch-off region close to the drains, carriers attain a maximum or saturation velocity of approximately $10^7$ cm/sec. Consequently, for a given Vinhall width $W_v = W - 2n$ (where W is the channel width and n is the width of the depletion layer at the boundaries of the channel) and for a given magnetic field B, the channel walls are stimulated to move a maximum distance. For this reason, device operation in the pinch-off mode is desired since the sensitivity of the Vinhall sensor reaches a maximum value.

Saturation velocity occurs at lower longitudinal electric field strengths in N type material than in P type material. Hence, N type channels were chosen. A subtle aspect of Eq. (17) suggests that the Lorentz voltage $V_L$ does not depend on the *number* of carriers conducted within the Lorentz region of the channel but rather on *carrier velocity*. In other words, it is possible to create a relatively intense Lorentz voltage while maintaining a low current density. This is a key aspect of the present invention.

Utilization of this principle is achieved in the present invention by properly coupling a Lorentz voltage to a *pair* of Vinhall channels. The result is a very sensitive field sensor. The basic device is illustrated by FIG. 4. FIG. 4 shows two spaced-apart Vinhall channels 4 connecting a single source region 5 to independent drain regions 6. The source and drain regions are heavily doped with a material type opposite to that of the semiconductive substrate material. The Vinhall channels 4 shown are formed by implanting them within the substrate to provide the filamentary type channels. These Vinhall channels are constructed in such a manner that the volume of the depletion region formed around the implanted channels represents a significant fraction of the total implanted channel cross section. By this means modulation of the dimensions of the depletion boundary by a Lorentz voltage changes a large fraction of the Vinhall channel conduction cross section. The spaced apart Vinhall channels are connected by an intervening channel 9 that I have defined as the Lorentz coupling channel. The characteristics of the Lorentz coupling channel 9 are quite different from the Vinhall channels. The principle differences are as follows:

(1) The Lorentz coupling channel has substantially lower carrier concentration (implanted or induced therein) than the carrier concentration provided to the Vinhall channels.

(2) The width $W_c$ of the Lorentz coupling channel is independent of the Vinhall width $W_v$.

The total current conducted by the Lorentz coupling channel is divided between the drain regions. However, it is but a fraction of the channel current conducted by either Vinhall channel. The basic function of the Lorentz channel is to couple a Lorentz voltage $\underline{V}BW_c$ developed therein to both Vinhall channels. The Lorentz channel provides the mechanism to modulate the position of the channel walls of the Vinhall channels.

Modulation of the depth of the depletion zones is believed to be the principle mechanism occurring within the Vinhall channels, particularly within the pinched-off channel regions close to the drains. This phenomenon is described by the theory of operation developed subsequently.

Figure 4A:
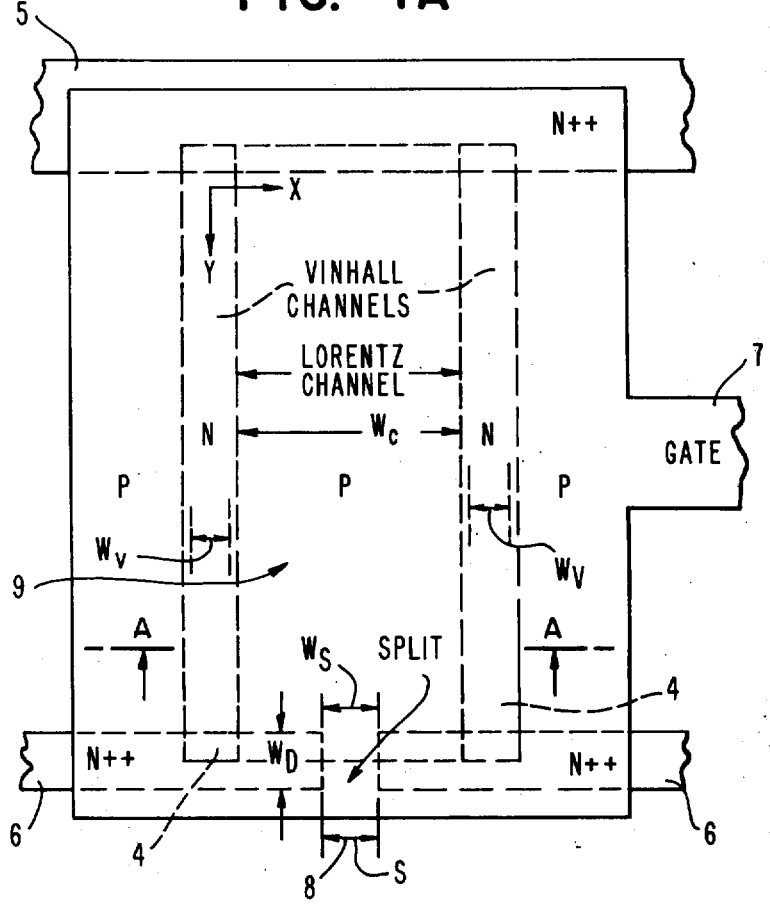
FIGS. 4A and 4B illustrate a simplified plan view and sectional view, respectively, of one preferred embodiment of a Lorentz coupled Vinhall twin channel sensor according to the invention.
Figure 4B:
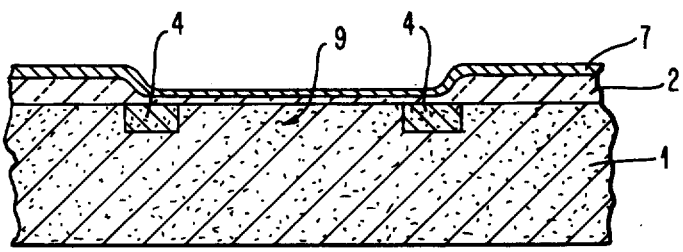

Referring to FIG. 4A, the Lorentz channel 9 is created by slightly inverting the surface of the semiconductive material 1 adjacent to and between the Vinhall channels 4. The inversion layer is created by the application of a voltage to the gate conductive region 7 separated from the Lorentz channel area 9 by means of a thin oxide layer 2. The thin oxide layer 2 below the gate 7 is shown in FIG. 4B to overlap the Vinhall channels 4. The principle reason for this overlap is due to the fact that the physical dimensions of the Vinhall channels are so small that overlap is necessary to guarantee electrical coupling between the Lorentz channel 9 and the Vinhall channels 4.

Figure 13:
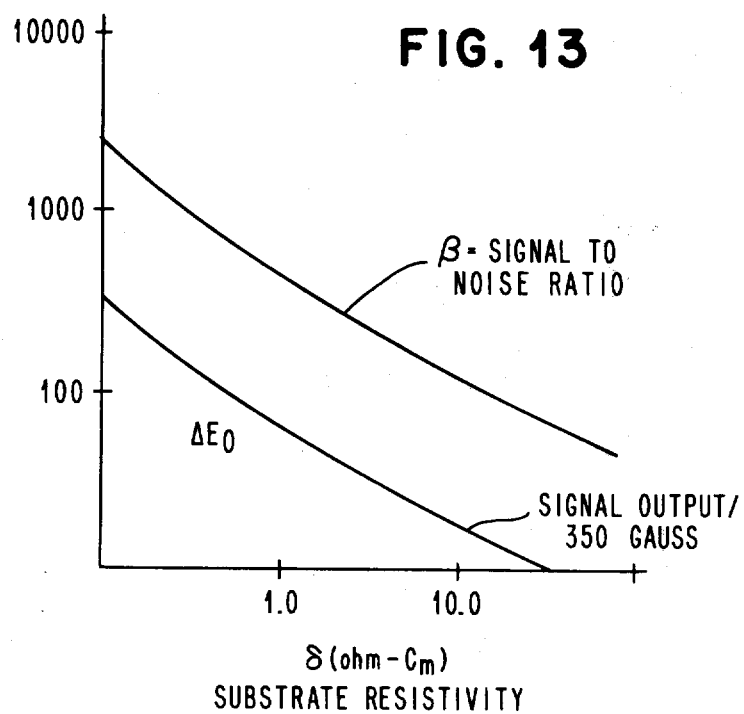
FIG. 13 illustrates signal levels and signal to noise ratios computed for a Vinhall structure as a function of substrate resistivity.

There is shown in FIG. 13 another embodiment of a two drain twin configuration. In the alternate embodiment, the Lorentz channel 9 is also implanted, but with a cumulative effective dose or carrier density which is less than the effective dose or carrier density implanted within the Vinhall channels 4.

Figure 12:
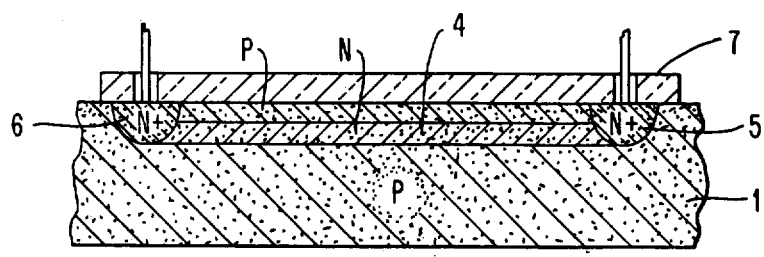
FIG. 12 illustrates an alternative embodiment to that shown in FIG. 11.

An opaque conductive gate 7 is also shown overlapping the spaced-apart Vinhall channels and the intervening Lorentz channel 9 in FIG. 4B. This gate 7 is also shown in FIGS. 12 and 13 and provides the means of eliminating device sensitivity to stray or undesirable electric fields and may also be used to deplete or enhance the Lorentz channel carrier concentration for the purpose of on/off gating or modulating the sensor's response to magnetic fields.

The operational flexibility of the Lorentz coupled Vinhall twin sensor shown in FIG. 4A is considerably greater than the previous flared channel device, FIG. 1 of my copending application Ser. No. 701,339 now U.S. Pat. No. 4,048,648. The equations developed for the Vinhall twin can be readily modified to reflect the performance of the flared channel device by simply eliminating the Lorentz channel term.

Figure 5A:
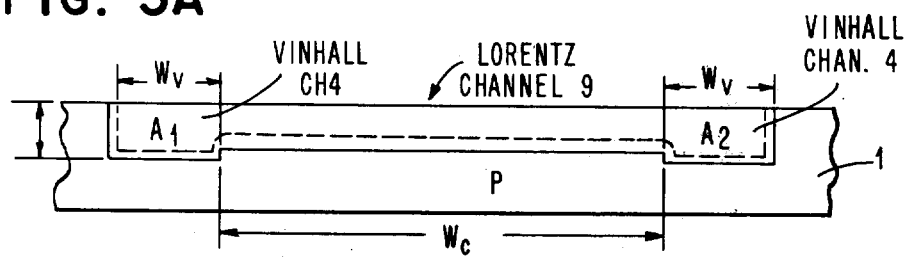
FIGS. 5A and 5B illustrate detailed cross-sectional views along section AA in FIG. 4A.
Figure 5B:
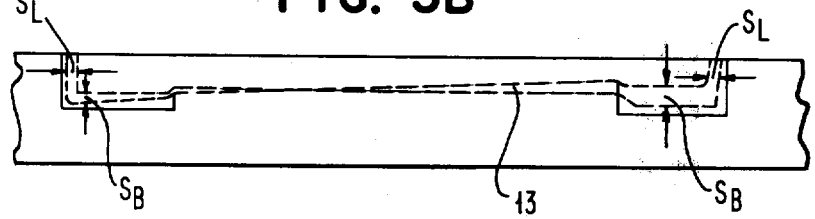

Consider FIGS. 5A and 5B, which are more detailed cross sectional views of the twin channel device, in FIG. 4B. In these figures, both Vinhall channels 4 and the interconnecting Lorentz channel 9 are shown. These figures correspond to section A—A identified in FIG. 4A. The solid line shown below the substrate surface represents the stochastic junction between the substrate 1 and channel region. The extreme left and right channel regions 4 correspond to the Vinhall channels and are implanted by use of ion implantation techniques. The intervening Lorentz channel 9 can also be created by use of implantation techniques or by inversion of charge by use of a gate 7. The gate 7 (not shown) is separated from the substrate surface 1 by means of a thin oxide layer 2 (not shown). By either means, the Lorentz channel 9 is electrically coupled to both Vinhall channels 4. The dashed line shown in FIGS. 5A and 5B, illustrates the static channel depletion boundaries or walls. These depletion boundaries form along the sides and bottoms of the channels and mark the end of the depletion process taking place within both the Vinhall and Lorentz channels. The length or depth $W_n$ of the depletion region formed within either channel is given by Eq. (18):

$$W_n = [\frac{2e_s}{q}(\phi + V_D(y) \pm V_L(y))(\frac{N_A}{N_A + N_D})\frac{1}{N_D}]^{\frac{1}{2}} \quad \text{Eq. (18)}$$

where:

$\phi$ is a contact potential:

$$= \frac{KT}{q} L_n(\frac{N_A N_D}{N_i})$$

$V_D(Y)$ is the drain voltage measured at point Y along the channel referenced to the source.

$V_L(Y)$ is the Lorentz voltage applied to the depletion boundaries at a point along the channel measured from the source.

Equation (18) approximates the depletion mechanism by assuming that the space charge, electric field, and junction potential behave according to the usual assumptions illustrated respectively by FIG. 10A through 10C. It is now desirable to consider the depletion boundary information mechanism and describe how this mechanism can be affected by a Lorentz voltage to create a differential signal in twin channel Vinhall sensors.

Figure 2A:
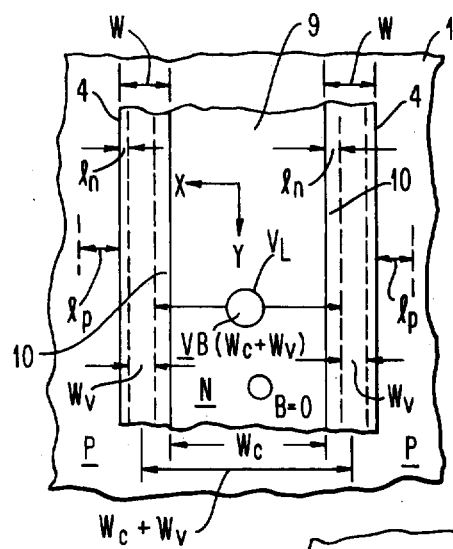
FIGS. 2A through 2C illustrate the mechanism of depletion boundary modulation in the width dimension of a single channel and show how depletion width modulation effectively moves the conductive channel boundaries in devices constructed according to the invention.

Consider FIG. 2A, for example, where a segment of an individual dual channel 4 with interconnecting Lorentz channel 9 is illustrated. The segments of channels 4 and 9 are understood to be formed within a semiconductive substrate area 1. The substrate material is illustrated as being of P-type material and the channel itself is of N-type material. The source 5 and the drain 6 are not shown. The source and drains would be of N+ type and all are formed using well-known technology for creating either an enhancement or depletion mode device.

It will be observed that P-N junctions exist along the boundaries of the channel and at the source and the drains wherever the N+-type material abuts the P-type substrate material.

As will be shown in greater detail below, there is a depletion zone created at all P-N junction interfaces in the device, including the bottom, sides, ends and in some cases, the top of the conductive channel itself. The analysis given now will be limited to a two dimensional view, momentarily ignoring depth modulation of the depletion zones at the top and the bottom of the channel. The effect of this simplification does not detract appreciably from understanding the basic operative mechanism at work in the invention. It should be understood, however, that the depletion width modulation equations are, in the final analysis, modified to account for the three dimensional effects.

It is well known that a depletion layer is formed at P-N junctions. The depletion layers within the N-type material are illustrated in FIG. 2A by the dashed lines inside of the channels 4 and are identified by the numeral 10. The layers 10 are formed in the vicinity of the P-N junction existing around the inner periphery of the channel and including the source and drains as shown in FIG. 2A. The following discussion will momentarily assume that the Vinhall channels 4 are not connected by the Lorentz channel 9 so that the depletion boundary mechanisms may be clearly described. When the Lorentz channel 9 is active, the inner edges of the channels 4 will not have the depletion boundaries shown in the FIGS. 2A-2C but will appear as in FIGS. 5A and 5B. The width of the depletion area 10 is identified as $l_n$. A similar layer exists in the P-type material surrounding the channel and it has a width $l_p$.

Particularly with regard to the depletion layers 10 existing along the inner edges of channels 4, the following observation is pertinent.

Electrons are conducted within the undepleted portion of the channel only. The width of this portion of the channel is narrower by $2 l_n$ than the physical width W which the channel exhibits.

The conductive portion of the channel's width is herein named the Vinhall width and is defined as follows:

$$W_V = W = 2l_n \qquad \text{Def. 1}$$

There exists a space charge potential, an electric field and a voltage potential across the boundary exhibited at the P-N junctions. FIGS. 10A through 10C illustrate the space charge region, the electric field and the potential that exist in the vicinity of a P-N junction formed at any interface between the channel material and the substrate such as shown in the figures.

FIGS. 10A through 10C are aligned along a vertical axis identified as the metallurgical junction. This junction is also known as the stochastic boundary or location of the P-N junction at which the donor and acceptor concentrations are equal. In FIG. 10A, the space charge is shown as a positive and negative charge distributed about the metallurgical junction with a positive charge in the N-type region and a negative charge in the P-type region. The nature of the distribution of this space charge is not well understood and only a crude approximation is shown in FIG. 10A. Due to the nature of the approximation shown, only general observations can be drawn from FIG. 10A. Firstly, there are different depletion widths $l_p$ and $l_n$ which exist in the P-type and N-type materials, respectively as a function of the acceptor and donor concentrations, respectively. Secondly, the magnitude of the space charge in the regions is the product of the donor density $N_D$ times the carrier charge q. Similarly, in the P-type region, the density of acceptors is $N_A$ times the electric charge q. Depending on the convention chosen for the sign of charge, the space charge in the P-type region is either plus or minus and that in the N-type region is either minus or plus, respectively. The convention chosen here is that charge in the N-type region is positive and in the P-type region is negative.

FIG. 10B illustrates the electric field existing between the depletion boundary edges in the P-type material and the N-type material across the metallurgical junction or Stochastic boundary.

The electric field can be determined by applying Gauss' law to the space charge distribution illustrated in FIG. 10A. The electric field so derived is shown in FIG. 10B. The expression shown in FIG. 10B is useful for developing a value for the potential as shown in FIG. 10C by integration.

The potential is of interest because it governs the width of the depletion zone on either side of the stochastic boundary and must be understood thoroughly before a depletion width modlation expression may be developed.

In FIG. 10C, the potential which exists at any point within the depletion zone in either the P- or N- type materials is illustrated as a maximum internal potential $\phi_0$. This potential is defined for semiconductive materials as equal to:

$$\phi_0 = \frac{KT}{q} Ln \left( \frac{N_A N_D}{N_i^2} \right) \qquad \text{Eq. (24)}$$

where Ln is the natural logarithm operator, K is Bolzmann's constant, T is the Kelvin temperature, and $N_i$ is the intrinsic carrier concentration in the substrate.

It can be shown that the width dimension $l_n$ of the depletion zone area within the channel 4 is approximated by the following equation.

$$l_n = \left[ \frac{2e_S}{q} (\phi_0 - V) \frac{N_A}{N_A + N_D} \frac{1}{N_D} \right]^{\frac{1}{2}} \qquad \text{Eq. (25)}$$

where the potential (voltage V) is applied external to a P-N junction.

It is understood that the expression in Eq. (25) is an approximation for the depletion layer width within and along the channel sides or bottom. A precise expression depends upon the actual distribution of space charge (donors and acceptors) which would be developed adjacent to the metallurgical junctions forming the depletion boundaries. The form and distribution of these regions is presently unknown. The expression given is the best currently available (see "Physical Electronics and Circuit Models of Transistors" by P. E. Gray, et al, pages 8-23, published in 1964 by John Wiley and Sons, New York).

In the above expression, $N_D$ is the donor concentration within the channel, $N_A$ is the acceptor concentration within the substrate material surrounding the channel, e is the dielectric constant for the material involved and q is the electron unit charge.

Now, as noted above, the effective width of the conductive area within the channel 4 is reduced from the physical width W by twice the depletion width $l_n$ Stated otherwise, the Vinhall width $W_V$ is defined as follows:

$$W_V = W - 2\left[ \frac{2e_S}{q} (\phi_0 - V) \frac{N_A}{N_A + N_D} \frac{1}{N_D} \right]^{\frac{1}{2}} \qquad \text{Eq. (26)}$$

From Eq. (26) it is evident that the width of the depletion layer $l_n$ along the sides of the channel depends upon a depletion width modulation voltage potential V applied external to the junctions. This voltage may be developed within a channel as a result of the Lorentz field $\underline{V}B$ developed across a channel with Vinhall width $W_V$, the Lorentz voltage $V_L = \underline{V}BW_V$ and is directed in the x direction given carriers moving down the channel in the y direction and a magnetic field being applied normal to the channel.

FIG. 2A illustrates the creation and application of the Lorentz voltage $V_L$ acting in the x direction toward the depletion boundaries along the channel 4 edges. This voltage is developed within the Lorentz channel 9 when it is active.

The general definition for a Lorentz voltage $V_L$ is given as a contour integral $$V_L = \int_{-\frac{W}{2}}^{\frac{W}{2}} (V_y \times B_z) dx,$$

taken between the P-N junctions forming the channel sides. The depletion layers 10 which exist along each edge of channel 4 in FIG. 2A are shown before the application of a magnetic field normal to the figure, i.e., in or out of the drawing, and before the creation of a Lorentz channel 9. When channel 9 is active, the innermost depletion layers 10 in channels 4 will not be present, and the Lorentz voltage will be developed across a width $W_C$ of channel 9 plus one half of $W_V$ from each channel 4.

Figure 2B:
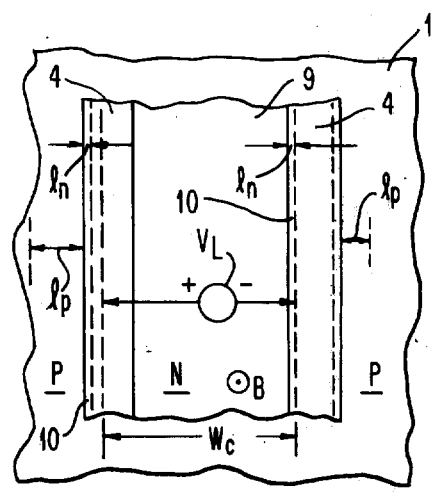
Figure 2C:
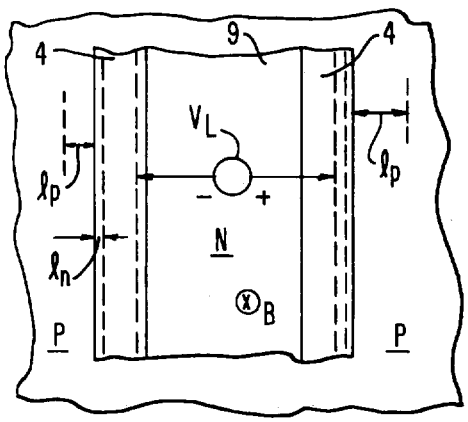

If a magnetic field is directed normal to the channels 4 and 9 and coming out of the page, a Lorentz voltage will be produced in channel 9 which, according to Eq. (25) above, will change the width $l_n$ of the depletion layers 10 at each edge of channel 9. In FIG. 2B, the magnetic field is directed out of the page and it will be seen that because of the depletion layer width modulation, both the outer depletion boundaries in the channels 4 move to the left in FIG. 2B. This effectively moves the conductive portions of the channels 4. The opposite condition is shown in FIG. 2C where the magnetic field is reversed and the effective boundaries of the channels move to the right.

A most interesting phenomenon has thus been described in which the erstwhile assumed rigid and immovable boundaries are actually moved when the carriers themselves within the channels could not effectively be deflected by the Lorentz field.

It is interesting to calculate an approximate relationship which may exist and to express the deflection distance for the motion of the channel boundaries which results when the Lorentz voltage, in the x direction, is applied to the channel boundaries.

It is now desired to determine how the Lorentz coupled Vinhall twin channel output signal is affected by modulating the position of the depletion boundaries with a Lorentz voltage developed across the Lorentz channel 9.

The principle region of interest along the channel is close to the drains where $Y \to L$. At this point, and with sufficient drain to source voltage applied, a pinch-off condition occurs and the channel depth diminishes to a terminal depth defined as a Debye length.

The application of a magnetic field with density B directed normal to the channels in FIGS. 5, causes a Lorentz voltage to be developed across the Lorentz channel 9 (width $W_c$) and across both effective Vinhall channels 4, each with width $W_v$. Now it should be clearly understood that when channel 9 is active, the innermost P-N junctions and depletion boundaries electrically cease to exist and the effective width of the Lorentz channel 9 becomes $W_C+W_V$, there being an added increment of $W_{V/2}$ contributed to channel 9 by each channel 4. This induced Lorentz voltage causes motion of the depleted channel walls by a distance S illustrated by means of the dashed line in FIG. 5B. The dotted line represents the static depletion wall boundaries which exist without the application of a downward directed magnetic field. The dashed line, FIG. 5B, corresponds to the dashed line, FIG. 5A.

The analysis which follows neglects the Lorentz induced depletion boundary effects produced within the Lorentz channel 9. The Lorentz channel 9 is lightly doped compared to the Vinhall channels 4. Consequently, negligible current change is introduced at the drains 6 as a result of modulating the depletion walls within the Lorentz channel 9. The relative magnitudes of the magnetically modified Vinhall channel 4 currents can be approximated by determining the relevant cross sectional areas $A_1$ and $A_2$ shown crosshatched in FIG. 5B. These areas are calculated to be as follows where T is the thickness (depth) of the channels ($S_L$ and $S_B$ being defined below).

$$A_1 = (W - Wn_L + S_L)(T - Wn_B + S_B) \quad \text{Eq. (27)}$$

$$A_2 = (W - Wn_L - S_L)(T - Wn_B - S_B) \quad \text{Eq. (28)}$$

The ratio of incremental channel current change $\Delta I_v$ produced by a magnetic field, to quiescent channel current, $I_v$, $\Delta I_v/I_v$, is defined as the magnetic sensitivity of the device.

An expression for magnetic sensitivity $\eta_v$ is obtained by use of Eq. (29).

$$\eta_v = \frac{\Delta I_v}{I_v} = \frac{2(A_1 - A_2)}{A_1 + A_2} \quad \text{Eq. (29)}$$

Where:
$I_v$ is the nominal Vinhall channel current
$\Delta I_v$ is the magnetically induced incremental change in the Vinhall channel current.

Expanding Eq. (27) and Eq. (28) and then forming the sum and difference expressions $A_1+A_2$ and $A_1-A_2$ yields:

$$A_1 + A_2 = 2[(W - Wn_L)(T - Wn_B) + S_L S_B] \quad \text{Eq. (30)}$$

$$A_1 - A_2 = 2[S_B(W - Wn_L) + S_L(T - Wn_B)] \quad \text{Eq. (31)}$$

Where:
$S_L$ is the differential distance that the depletion boundaries move along the channel sides, in response to the Lorentz voltage applied to these boundaries.

$S_B$ is the differential distance that the depletion boundaries move along the channel bottom, directly below the center of the Vinhall channels, in response to the Lorentz voltage applied to these boundaries.

Substituting Eq. (30) and Eq. (31) into Eq. (29) gives the desired basic expression for the magnetic sensitivity $\eta_v$.

$$\eta_v = \frac{\Delta I_v}{I_v} \quad \text{Eq. (32)}$$

$$\frac{2[S_B(W - Wn_L) + S_L(T - Wn_B)]}{(W - Wn_L)(T - Wn_B) + S_L S_B}$$

$$\eta_v \approx \frac{2[S_B(W_v) + S_L(T - Wn_B)]}{W_v(T - Wn_B) + S_L S_B}$$

Equation (32) can be further simplified by assuming that the product $S_L S_B << W_v(T-Wn_B)$. This is a reasonable assumption since $S_B$ may be of the same order of magnitude as $T-Wn_B$ but $S_L$ is much less than the Vinhall width $W_v$, particularly since the magnitude of $S_L$ is proportional to $W_v$. Given this assumption, Eq. (32) reduces to the following:

$$n_v = 2\frac{S_B}{T-Wn_B} + \frac{S_L}{W_v} \quad \text{Eq. (33)}$$

Equation (33) reveals that the sensitivity of the Vinhall twin depends on two factors. The first factor $$\frac{S_B}{T-Wn_B}$$

defines the ratio of depletion *depth* modulation to the depth of the depletion layer within the channel. The second term defines the ratio of depletion *width* modulation to the Vinhall width $W_v$. The second term becomes insignificant compared to the first in the vicinity of the drains when the pinch-off condition is caused to occur. Under these circumstances, the depth factor $T-Wn_B$ converges to the limiting depletion layer thickness mentioned before as a Debye length. If it were not for this limiting depth, the sensitivity expression Eq. (33) would reach an extremely high value. As it turns out, the Debye length is an order of magnitude greater than the maximum depth modulation distance $S_B$, and a fraction of the implanted channel depth T. Consequently, the maximum sensitivity of the Vinhall device is in the order of 10%, (which incidently is still a very significant percentage).

The expression used in this application for the Debye length $D_D$ is given by Eq. (34).

$$T_D = \lim_{Y \to L} T-Wn_B = \frac{\epsilon K_B T}{q^2 N_i}\left(\frac{N_i}{N_{Ds}}\right) \quad \text{Eq. (34)}$$

Where:
- $\epsilon$ = Dielectric constant of Silicon
- $K_B$ = Boltzman Constant
- Y = Temperature (Kelvin)
- q = Electron Charge; $1.6 \times 10^{-19}$ Coulombs
- $N_i$ = Intrinsic Carrier Concentration; $1.8 \times 10^{-10}$ Cm$^{-3}$ for Silicon
- $N_{Ds}$ = Donor Concentration at Surface of the Channel Evaluating Eq. (34) for room temperature conditions 300° K. and silicon as the substrate material gives:

$$T_D = \lim_{\text{Pinch off}} (T-Wn_B) = 35 \times 10^{-4}\frac{N_i}{N_{Ds}} \quad \text{Eq. (35)}$$

Substituting Eq. (35) into Eq. (33) for $T-Wn_B$ gives:

$$\lim_{\substack{Y \to L \\ \text{Pinch off}}} \eta = 2S_B(2.86 \times 10^{+2}\frac{N_{Ds}}{N_i}) \quad \text{Eq. (36)}$$

To recapitulate: The sensitivity of the Lorentz coupled Vinhall twin sensor depends on modulation of the depletion regions of the Vinhall channels in both width and depth. However, considering positions along the channel length close to the drains where pinch-off is induced, the device sensitivity depends primarily on depth modulation of the pinched-off channel region. In other words, the Lorentz voltage is effective in modulating the pinched-off Debye depth. This is considered to be a significant observation because now it is clear that the depth behavior of the channels in the pinched-off region is a dominant factor which accounts for the high sensitivity of the Lorentz coupled Vinhall device.

The next step in the analysis is to derive an expression for the depletion depth modulation term $S_B$ given in Eq. (36). Equation (18) gives the expression for the width or depth of the depletion region *within* the channel. There are three voltage terms in Eq. (18): contact potential $\phi$, drain to source voltage $V_D(y)$ and the Lorentz voltage $\pm V_L(y)$. The Lorentz voltage is obtained from a contour integral and can be approximated by Eq. (37).

$$V_L(y) = \underline{V}(y) B(y) [W_c + W_v(y)] \quad \text{Eq. (37)}$$

Where:
- $\underline{V}(y)$ is the average velocity of the carriers conducted within the channel at position y measured from the source reference point.
- B(y) is the intensity of the magnetic field applied normal to the channel at the same position y along the channel.
- $W_v(y)$ is the Vinhall width of the channel at the same position (y) along the channel.
- $W_c$ is the width of the Lorentz coupling channel.

Half of the Lorentz voltage Eq. (37) is effective in modulating the outer walls defining each Vinhall channel 4; i.e., half of the Lorentz voltage modulates the left Vinhall channel while the other half modulates the right Vinhall channel.

In the pinch-off region of the Lorentz channel 9 and Vinhall channels 4, the total Lorentz voltage becomes:

$$V_L = \underline{V}_s B (W_v + W_c)$$

The velocity term $\underline{V}(y)$ in Eq. (37) corresponds to the average saturation velocity $\underline{V}_s$ which describes carrier motion within the pinched-off region of the channel.

The expression defining modulation of the depletion depth $S_B$ by a magnetic field is given in differential form by Eq. (39).

$$S_B = \frac{dW_n}{dB} = \frac{\partial W_n}{\partial V_L}\frac{dV_L}{dB} \quad \text{Eq. (39)}$$

The term $dV_L/dB$ can be obtained from Eq. (38) and the term $$\partial W_n/\partial V_L$$

can be obtained from Eq. (18).

The result is given by Eq. (40)

$$S_B = \tfrac{1}{2}B\underline{V}_s(W_c+W_v)(K/V_p)^{\tfrac{1}{2}} \quad \text{Eq. (40)}$$

Where:

$$K = \frac{2\epsilon_s}{q}\frac{N_A}{N_A+N_D}\frac{1}{N_D} \quad \text{Eq. (41)}$$

$V_p$ = Pinch-off Voltage

The other voltage terms, $\psi$ and $V_L$, Eq. (18), do not appear in Eq. (40) since they are negligible when considering pinch-off conditions; i.e., $$V_D(L) = V_p >> \phi + V_L(L) \quad \text{Eq. (42)}$$

The next step in the analysis is to obtain an expression for pinch off voltage. The question now arises as to whether the Lorentz or Vinhall channels were implanted or whether they were created by inducing an inverted charge layer as normally done in FET technology by means of a voltage applied to a gate. If the channel is inverted by application of gate voltage $V_g$, then the pinch-off voltage $V_p$ is simply approximated as follows:

$$V_p \approx V_g - V_T = V_g^1 \qquad \text{Eq. (43)}$$

Where $V_T$ is defined as the threshold voltage. If, however, the Lorentz channel is implanted, then the pinch-off voltage $V_p$ is obtained by means of the following derivation:

PINCH-OFF VOLTAGE IN DEPLETION MODE DEVICES

The simplest method of approximating the pinch-off voltage $V_p$ for an implanted channel, is to start with Eq. (18) and substitute the average stochastic channel depth $\overline{T}$ for depletion depth $W_n$ giving, $$\overline{T} = \frac{2\epsilon_s}{q}(\phi + V_p \pm V_L)\frac{N_A}{N_A + N_D} \frac{1}{N_D}^{\frac{1}{2}} \qquad \text{Eq. (44)}$$

In the vicinity of the drain regions, $V_p >> \phi \pm V_L$. Therefore, Eq. (44) can be simplified to the following:

$$\overline{T} = \frac{2\epsilon_s}{q}(V_p)\frac{N_A}{N_A + N_D} \frac{1}{N_D}^{\frac{1}{2}} \qquad \text{Eq. (45)}$$

It would appear that now all that remains is to solve Eq. (45) for $V_p$. First, however, it is necessary to give consideration to the meaning of donor concentration $N_D$ Eq. (45).

The notions of Debye length and pinch-off require considerations of the distribution of donor concentration as a function of depth and in particular donor concentration appearing at the substrate surface.

Figure 7:
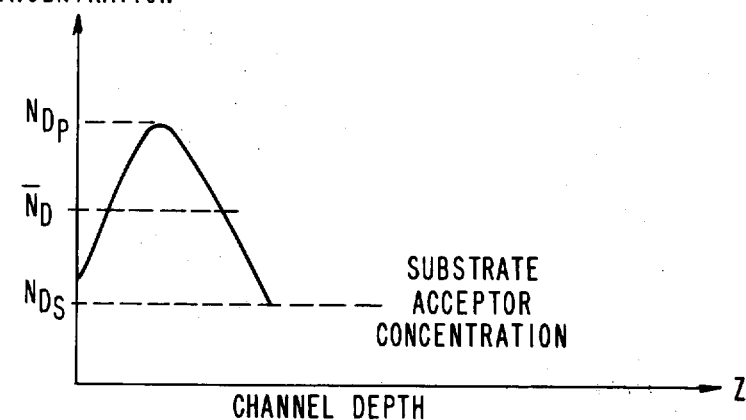
FIG. 7 illustrates a typical profile of implantation carrier concentrations as a function of channel depth below the surface of a substrate.

Consider FIG. 7 which illustrates a typical implanted profile of carrier concentration as a function of channel depth below the substrate surface.

Three different donor concentrations have been identified; surface concentration $N_{Ds}$, average concentration $\overline{N}_D$, and peak concentration $N_{Dp}$. The notions of a minimum depth for the depletion layer defined as a Debye length, described earlier, depends on the surface carrier concentration $N_{Ds}$. Specifically, it is essential that the surface concentration $N_{Ds}$ be equal to or greater than the substrate concentration $N_A$, otherwise the Debye length conditions assumed at pinch-off may no longer apply.

Solving Eq. (45) for pinch-off voltage $V_p$ with FIG. 7 in mind, one obtains the following expression:

$$V_p = \frac{\overline{T}^2 q}{2\epsilon_s} \frac{\overline{N}_D}{N_A}(N_A + N_{Ds}) \qquad \text{Eq. (46)}$$

Eq. (47) (below) is written in terms of dose density D rather than acceptor and donor concentrations $N_A$ and $N_D$, respectively. This is a particularly helpful tool when one is faced with fabricating these devices using either the enhancement mode of operation where cajjaers are induced to form a channel by the application of a control gate voltage or in the depletion mode of operation where doping or ion implantation techniques are utilized to create a channel in the substrate. Cumulative dose is usually a known variable in such processes and the acceptor and donor concentrations are not so well known or ascertainable.

The basic definition of implant Dose D required to create the desired donor or acceptor concentrations can be stated in terms of the product of average channel depth $\overline{T}$ and average donor concentration $\overline{N}_D$; i.e., $D = \overline{N}_D \overline{T}$. Substituting $\overline{T} = (D/\overline{N}_D)$ into Eq. (46) we get Eq. (47) as the desired expression for the implanted channel pinch-off voltage $V_p$.

$$V_p = \frac{DTq}{2\epsilon_s} \frac{N_A + N_{Ds}}{N_A} \qquad \text{Eq. (47)}$$

Where: $\epsilon_s$ is the dielectric constant for the substrate.

This expression can be used to determine the pinch-off conditions for both the Lorentz and Vinhall channels.

We are now prepared to solve Eq. (40) in order to obtain the desired expression for depletion depth modulation $S_B$. Substituting Eq. (47) for $V_p$ and Eq. (41) for K modified to include the surface donor concentration notation $N_D = N_{Ds}$, into the term, $(K/V_p)^{\frac{1}{2}}$, Eq. (40), we get, $$S_B = \frac{BV_s(W_c + W_v)}{2}\left(\frac{\epsilon_s}{qD}\right)\left(\frac{N_A}{N_A + N_{Ds}}\right) \qquad \text{Eq. (48)}$$

Substituting Eq. (48) into Eq. (36) we obtain the desired expression for Vinhall device sensitivity $$\eta_v = \frac{\Delta I_v}{I_v} \qquad \text{Eq. (49)}$$

$$\eta_v = \frac{\Delta I_v}{I_v} = 2.86 \times 10^2 \frac{N_{Ds}}{N_i} BV_s(W_c + W_v)\frac{\epsilon_s}{qD} \frac{N_A}{N_A + N_{Ds}}$$

Equation (49) can be re-written to define a special situation where the implant conditions are controlled so as to cause the net surface concentration $N_{Ds}$ of the implanted Vinhall channels to be equal to the acceptor concentration $N_A$ of the substrate; i.e., $N_{Ds} = N_A$. For this special case, Eq. (49) becomes, $$\eta_v = 1.43 \times 10^2 \frac{N_A}{N_i} BV_s(W_c + W_v)\frac{\epsilon_s}{qD} \qquad \text{Eq. (50)}$$

for
$N_{Ds} = N_A$

The differential response signal of the Lorentz coupled Vinhall twin device is obtained by forming the product $R_L \Delta I$. This product is obtained by multiplying Eq. (49) by $R_L$ (the device load resistor) and a suitable expression for channel current $I_c$.

Equation (51) below gives an expression which defines the current flowing within the Vinhall channels corresponding to pinch-off conditions.

$$I_{c_{\text{Pinch}}} = (Dq)^2\left(\frac{W_v}{L}\right)\frac{\mu T}{2\epsilon_s}\frac{N_A + N_{Ds}}{N_A} \qquad \text{Eq. (51)}$$

Forming the product of Eq. (50) with Eq. (51) and $R_L$ gives the desired expression for the differential signal voltage measurable between the two drains operating in pinch-off, and given a magnetic field with density B applied normal to the channel.

$$\Delta E = 1.43 \times 10^2 R_L \frac{N_{Ds}}{N_i} Dq\left(\frac{W_v}{L}\right) \mu T BV_s(W_c + W_v) \quad \text{Eq. (52)}$$

It is evident from Eq. (52) that essentially any signal amplitude desired can be achieved from the device, given pinch-off conditions, by simply using an appropriately large value for the load resistor $R_L$. In essence, this is true. However, the drain supply voltage $V_{DD}$ must also increase directly with the value chosen for $R_L$. In order to insure that a reasonable compromise is achieved, a nominal load resistance $R_{Lo}$ is defined as follows.

The pinch-off channel current can be expressed in the following form:

$$I \text{ pinch} = V_p [D (W_v/L) q\mu] \quad \text{Eq. (53)}$$

Where $V_p$ is the drain to source pinch-off voltage.

Figure 8:
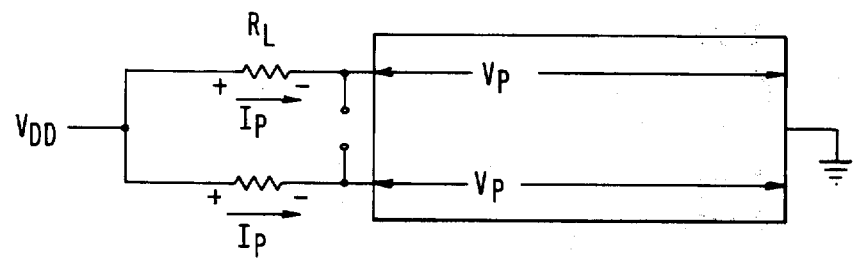
FIG. 8 illustrates the circuit for operating the twin Vinhall channels at pinchoff.

Equating the steady state voltage drop, I pinch $R_{Lo}$, developed across the load resistor $R_{Lo}$, FIG. 8, to the Vinhall channel pinch-off voltage $V_p$ gives:

$$R_{Lo} V_p [D (W_v/L) q\mu] \leq V_p \quad \text{Eq. (54)}$$

Solving Eq. (54) for $R_{Lo}$ gives the following expression for the nominal load resistance.

$$R_{Lo} \leq \frac{L}{W_v}\left(\frac{1}{Dq\mu}\right) \quad \text{Eq. (55)}$$

This expression defines the maximum value for load resistor $R_L$ such that the drain supply voltage requirements $V_{DD}$ will never exceed twice the pinch-off voltage $V_p$ of the channel. Larger signal responses may be obtained by use of larger values for load resistor $R_L$, however at the expense of increased drain supply voltage (and consequently more noise).

Substituting $R_{Lo}$ given by Eq. (55) into Eq. (52), one obtains an expression for the nominal differential signal voltage $\Delta E_o$.

$$\Delta E_o = 1.43 \times 10^2 \frac{N_{Ds}}{N_i} TBV_s(W_c + W_v) \quad \text{Eq. (56)}$$

Again considering the special case where the implanted surface carrier concentration $N_{Ds}$ is equal to the substrate acceptor concentration $N_A$; Eq. (56) becomes $$\Delta E_o/N_{Ds} = 1.43 \times 10^2 \frac{N_A}{N_i} TBV_s(W_c + W_v) \quad \text{Eq. (57)}$$
for $N_{Ds} = N_A$ It is evident from Eq. (56) that the nominal signal voltage increases with the surface donor concentration $N_{Ds}$ greater than the acceptor concentration $N_A$ while for the same condition the device sensitivity $\eta_v$ Eq. (49) decreases. The significance of low substrate resistivity; i.e., large values for $N_A$ and correspondingly large surface concentration $N_s$ can best be appreciated by examining the conditions required to achieve large signal to noise ratios from the Vinhall sensor.

A basic motivation for sensor development is to be able to reliably read encoded magnetic stripe data. The maximum flux density experienced in close proximity to an encoded magnetic stripe is approximately 350 Gauss. The minimum field to be sensed can be as low as 20 Gauss. The 350 Gauss field value is used in the following analysis to determine the maximum practical signal to noise ratio obtainable from the Vinhall structure.

In determining the signal to noise ratio, the usual conditions which define statistical noise will be considered. There are other potential noise sources such as injection and 1/f noise. The latter being stimulated by generation and recombination processes and by curved electron trajectories occurring close to the drains. These other types of noise sources are not understood well enough to include them in the analysis. The noise that is considered is called "shot noise" and is caused by statistical variations in channel current flowing through a resistive load element. The statistical noise developed across the drain load resistor $R_L$, FIG. 1, is given by Eq. (58).

$$V \text{ noise} = R_L 2q I_c \Delta f \quad \text{Eq. (58)}$$

Where:
$R_L$ is the value of load resistance in ohms.
q is electron charge
$I_c$ is the Vinhall channel current
$\Delta f$ is the useful bandwidth of the sensing system amplifier.

The statistical signal to noise ratio is defined as $\beta$ and is given as $$\beta = \frac{\Delta E}{V \text{ noise}} = \frac{R_L \Delta I}{V \text{ noise}} \quad \text{Eq. (59)}$$

Recalling the definition for sensitivity $\eta_v$ given by Eq. (34), Eq. (59) can be rewritten as follows:

$$\beta = \eta_v \frac{I_c}{2q \Delta f} \quad \text{Eq. (60)}$$

Notice that the signal to noise ratio is independent of load resistance $R_L$. Therefore, adjustment of this load resistance for other reasons is permissible. The term $$\frac{I_c}{2q \Delta f}$$

Eq. (60), is solved by use of Eq. (51) corresponding to channel pinch-off conditions.

$$\frac{I_{c \text{ pinch}}}{2q \Delta f} = \frac{D}{2} \frac{q}{\Delta f}\left(\frac{W_v}{L}\right)\frac{\mu T}{\epsilon s} \frac{N_A + N_{Ds}}{N_A} \quad \text{Eq. (61)}$$

An expression for signal to noise based on Eq. (60) can be obtained by simplifying the product of Eq. (61) and Eq. (49) as prescribed by Eq. (60). The result is given by Eq. (62).

$$\beta = 1.43 \times 10^2 \frac{N_A}{N_i} \frac{N_{Ds}}{N_A + N_{Ds}} BV_s(W_c + W_v) \times \frac{\epsilon_s}{q\Delta f}\left(\frac{W_v}{L}\right) \mu T \quad \text{Eq. (62)}$$

Equation (62) implies that the maximum signal to noise ratio can be achieved given large acceptor concentrations $N_A$ (low substrate resistivity) and if the surface donor concentration $N_{Ds}$ provided during implant is greater than $N_A$; i.e., $N_{Ds} > N_A$. This latter criterion contradicts the conditions necessary to achieve maximum sensitivity $\eta_\nu$. However, the parameter requirements needed to maximize the signal to noise ratio $\beta$ in Eq. (62), are considered to be most relevant to sensor design optimization because they reflect the conditions necessary to achieve an operable device. Nothing can be more deleterious to sensor performance than to possess a poor signal to noise ratio.

FIG. 13 is a plot of the signal to noise ratio $\beta$ and nominal signal amplitude $\Delta E_o$, predicted for the Vinhall twin, as a function of substrate resistivity in ohm-cm. The other parameter values assumed in the computation, are listed in the upper right corner of the figure. A 60 db signal to noise ratio and a 140 mv nominal signal level $\Delta E_o$ can theoretically be achieved from such a device given a 350 Gauss field and a substrate resistivity of 0.3 ohm-cm. Higher signal to noise ratios and signal levels can be achieved by increasing the width of the Lorentz channel from the 0.3 mil value used in the above calculations or by lowering the substrate resistivity. It is anticipated, however, that drain breakdown problems may possibly occur if a substrate resistivity below 0.2 ohm-cm is used to fabricate Vinhall sensors.

Figure 3B:
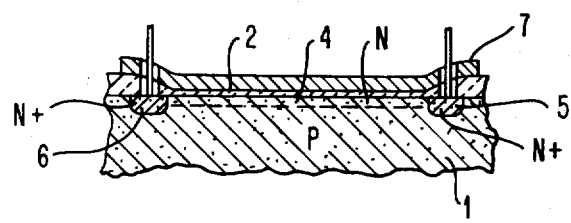

Turning now to a brief consideration of enhancement mode channel conduction devices, attention will be turned to FIGS. 3A and 3B. In FIG. 3B a longitudinal cross section of the device shown in FIG. 3A is illustrated in which a semiconductive metal substrate 1 has implanted in it or diffused in it a source 5 and one or more drains 6. The surface of the substrate, particularly in the vicinity of the channel 4 is overlain by a thin insulating oxide layer 2 well known in the art and an evaporated or otherwise deposited aluminum metal or other conductive material which forms a gate 7 to which suitable control voltages may be applied.

As is well understood by those of skill in the art, this constitutes a field effect transistor channel structure in which, with suitable voltages on the control gate 7, the source and drains 5 and 6, respectively, a conduction channel 4 of carriers called an "inversion layer" will be induced to form between the source 5 and drains 6. This has the effect of creating an effective carrier dose density which is definable in the same sort of terms as were used previously for an implanted channel device in which the carriers or ions necessary to form the channel are implanted below the substrate surface. It may be shown that the signal output of the enhancement mode device in which carriers are induced to form a conductive channel is linear with gate voltage and less sensitive than a buried (depletion mode) channel device. The loss in sensitivity and output is a result of a thin channel thickness T and a high equivalent channel donor concentration $N_D$. The latter diminishes the amount of depletion boundary modulation that may be achieved along the channel boundaries for a given Lorentz field.

The equations described above show that a Vinhall sensor has performance properties stated in terms of dose among other parameters. Enhancement mode Vinhall configurations do not have an implanted dose as such, but do have an equivalent dose in the inverted charge layer created by the gate electrode and by the thin oxide layer which separates the gate electrode from the surface of the silicon substrate. Assuming that the concentration $N_D$ of carriers which are inverted to the surface of the channel is uniform within a thickness layer T of about 1000Å, an equivalent induced dose density $\overline{D}$ can be derived by considering the boundary conditions for the dielectric field at the surface of the semiconductor produced by action of the gate voltage acting across the thin oxide layer toward the silicon substrate. The relationship between the effective dose $\overline{D}$ and the gate voltage $V_g$ is given by Eq. (63) as follows:

$$\overline{D}=(V_g C_o)/2q \qquad \text{Eq. (63)}$$

where $C_o$ is the gate capacitance per centimeter squared and is equal to the dielectric constant e divided by the thickness of the oxide layer $t_{ox}$.

By substituting the expression that shows the effective dose $\overline{D}$ in Eq. (63) for the implanted dose density in the Vinhall depletion mode equations given earlier, one may obtain the equivalent expression for the enhancement mode devices. It is important to note that the operation of the Vinhall devices as embodied in either the enhancement or the depletion mode follows an identical mechanism.

Figure 11:
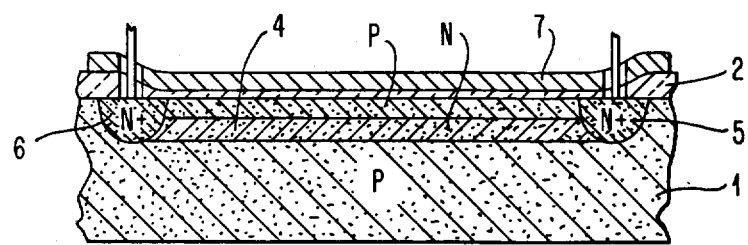
FIG. 11 illustrates a longitudinal cross-section of a typical implanted channel of the type used in the invention.

FIG. 11 illustrates in longitudinal cross section a typical semiconductor substrate 1 having a channel 4 buried beneath the surface of the substrate 1 and having the following characteristics:

The channel 4 is created by implanting phosphorus, for example, in such a manner that a deep and uniform carrier concentration is developed below the substrate surface and extending to a depth of approximately 4,000Å units or more. A typical cumulative does or fluence that is desired is approximately $2 \times 10^{12}$ ions/centimeter squared during the implantation process. It is most desirable that this fluence be implanted consecutively with energies ranging from 50 KEV to 200 KEV. A deep channel with thickness T in the 4,000Å range is, therefore, produced beginning at approximately 500Å below the surface of the substrate. Such a channel is desired for achieving the necessary channel current while allowing substantial depletion boundary modulation along the sides of the channel to occur. As noted above, in derivation of the equations, it is also important to bury the channel at some significant depth below the surface of the semiconductive substrate to reduce noise conditions to enhance the signal-to-noise ratio. The control gate 7 serves as an electrical shield to reduce noise but is not needed to control the channel conduction.

FIG. 12 illustrates an alternative embodiment to that shown in FIG. 11 in which the metal control gate 7 has been entirely removed and an opaque insulator 16 is shown above the top surface. The purpose of opaque insulator layer 16 is to prevent light entering the semiconductor substrate and causing noise due to photon energy ejection of electrons in the channel.

The most sensitive region of the Vinhall device is in the vicinity of the drains and is the only region requiring a magnetic field in order to modulate the depletion boundaries labeled B in FIG. 5B. This feature of the Vinhall sensor not only accounts for its high resolution, but also for its high sensitivity. Thus, the Vinhall sensor acts as essentially a point sensor.

If the Vinhall device is operated below the pinch-off voltage (see FIG. 9), it is desired that the width $W_d$ of the drains 6 shown in FIG. 4A be less than or equal to the width S of the slit 8. Otherwise, the conductance between the drains 6 will excessively attenuate the differential signal response measured between the drains.

A narrow slit 8 between drains 6 is desired to achieve the best Vinhall device sensitivity. Special fabrication techniques may be employed to achieve a narrower slit width. One method is to implant the two drain contact regions 6 as close together as the photolithographic mask techniques will permit and then to follow with a post diffusion annealing operation which permits limited ion migration at a critical annealing temperature near the diffusion temperature. This is approximately 1000° C. for silicon, but, as is known in the art, varies for different materials. The result of this operation is a slit width which is less than the minimum mask width that can be generated in the photolithographic technique.

A second technique for making a narrower slit is to implant a continuous drain region initially without a slit. An effective slit may then be formed by using electron beam technology to provide a very narrow slit mask. Ions of the material opposite to the type in the slit area already may then be implanted so as to create an electrical separation between two regions of the drain. The opposite material type implanted forms an effective slit which neutralizes the initial implant in this region. In this manner, the slit region can be made to be intrinsic in resistivity or the same type material as the channel. The separate drain members thus formed are highly doped to prevent their depletion at high drain voltage conditions.

Alternative embodiments offering still further improvement in operation are illustrated in FIGS. 14A and 14B and 15A and 15B.

Figure 14A:
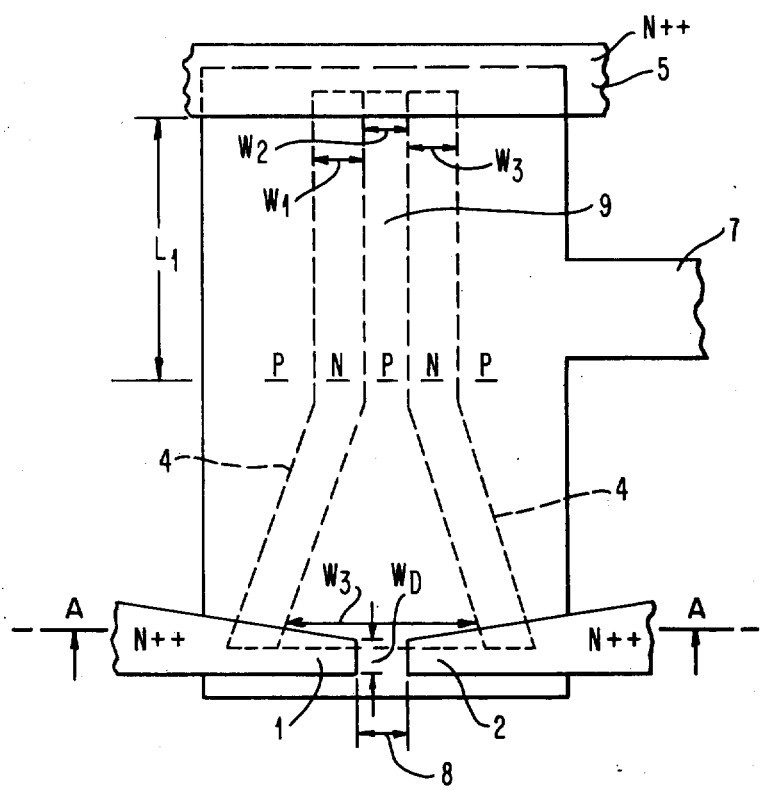
FIGS. 14A and 14B illustrate an alternative preferred embodiment in which the Lorentz coupling is flared or widened in the vicinity of the drains in an enhancement mode device.

Turning to FIG. 14A, a plan view of an improved Lorentz coupled twin Vinhall channel sensor structure is shown. The basic differences illustrated in FIG. 14A from the embodiments discussed previously are in the flared portion of the Lorentz coupling channel in the vicinity of the drains 6. As may be seen in FIG. 14A, at some distance $L_1$ measured from source 5, a break in the parallel arrangement of the Vinhall channels 4 and the Lorentz channel 9 occurs so that they diverge, thereby increasing the width of the Lorentz channel 9. The structure is otherwise of the same type as that discussed previously with regard to FIGS. 4A and 4B and others of the similar type described herein. In this structure, the Vinhall channels 4 are formed by an ion implantation technique previously discussed. They are filamentary in form and are constructed in such a manner that the volume of the depletion region formed around the implanted channels 4 represents a significant fraction of the total implanted cross-sectional channel area. By this means, the modulation of the depletion boundary dimensions by the coupled Lorentz voltage changes as large a fraction of the channel conduction cross-section as is possible. The flared Lorentz coupling channel shown in FIG. 14A has characteristics that are quite different from the Vinhall channels.

The principle difference in the flared Lorentz channel is that it has substantially lower carrier concentration (either by implantation or by inducement) and the carrier concentration provided in the Vinhall channels 4. A second major difference is that the neck portion of the flared Lorentz coupling channel 9 (that portion closer to the source 5) basically determines by its width and depth the total amount of Lorentz channel current in a manner which is virtually independent on the events taking place within the flared region of channel 9 closer to the drains 6. The flaring technique further reduces the intensity of the Lorentz channel current component appearing at the drain contacts 6 and improves the Lorentz voltage per unit current available to modulate the depletion boundaries surrounding the Vinhall channels 4 in the vicinity near the drains. A third major difference is that the width factor shown as $W_3$ in the figures, for the Lorentz channel determines the extent of the depletion modulation within the Vinhall channels while the width $W_2$ of the Lorentz coupling channel controls the Lorentz channel current given the effective dose implanted or induced to a given depth within that channel.

The total current conducted by the Lorentz coupling channel 9 is divided between the drain region 6 and represents but a small fraction of the channel current conducted by either Vinhall channel 4. The basic function of the flared Lorentz channel 9 is the same as that as the unflared Lorentz channels but offers the improvements noted above. Significant increases in sensitivity and in signal to noise ratios are obtained using structures of this type.

Figure 14B:
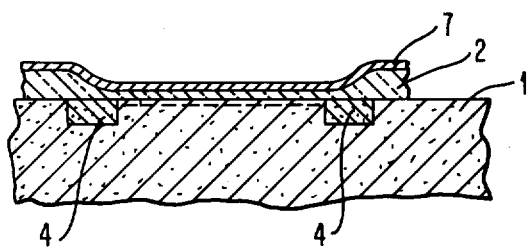

FIG. 14B illustrates in cross-section the section of the structure illustrated in FIG. 14A along the second lines AA. FIG. 14B indicates that the mode of operation of the device as shown is in the enhancement mode in which an inversion layer for conduction of carriers is created by the application of a voltage to the gate conduction layer 7. The conductive gate is of metal and is separated from the surface of the semi-conductor substrate 1 by a thin silicon dioxide layer 2. The metal gate 7 overlaps both the Vinhall channels 4 and the Lorentz coupling channel 9. This overlap is necessary to guarantee a good electrical coupling between the Lorentz coupling channel 9 and the Vinhall channels 4.

Returning to FIG. 14A, widths $W_1$ and $W_3$ of the Vinhall channels 4 would be essentially the same as those described for FIG. 4A, for example. These Vinhall channels 4 are filamentary in form but may also be flared toward the drain 6 in the same manner that the Lorentz channel 9 was flared in FIG. 14A.

Figure 15A:
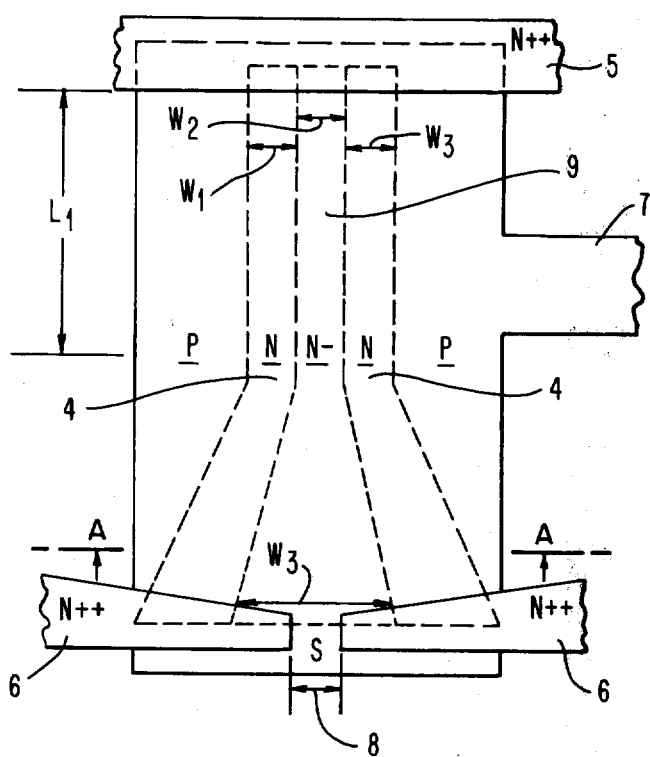
FIGS. 15A and 15B illustrate another alternative preferred embodiment in which both the Vinhall channels and the Lorentz coupling channel are flared in the vicinity of the drains in depletion mode device.
Figure 15B:
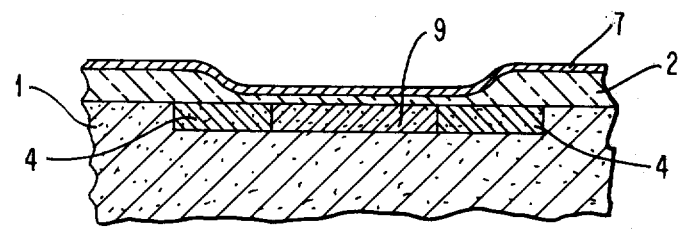

Turning to FIG. 15A and 15B, this situation is illustrated for a depletion mode Lorentz coupled Vinhall twin sensor structure.

In FIG. 15A, the structure is essentially similar to that in FIG. 14A, but the Vinhall channels 4 are also flared outward in the vicinity of drains 6. As with FIG. 14A and 14B, the slit 8 and the widths at the necks of the respective channels 4 and 9 ($W_1$, $W_2$ and $W_3$ as shown) are all essentially the same as those previously described for the other embodiments herein.

In FIG. 15A, the Lorentz coupling channel 9 and the Vinhall channel 4 are all flared outward toward the drains 6. This provides a further increase in performance for essentially the same reasons as those described above for the flared Lorentz channel 9.

In FIG. 15B, a cross-section along section AA of FIG. 15A, it may be seen that the depletion mode of sensor has been illustrated in which an effective implantation dose in the Lorentz channel area 9 is formed at the time the Vinhall channels 4 and the drains 6 are formed by the implantation process. However, the dose density in the coupling channel 9 is much less than that required for the Vinhall channels 4 or the drains 6. Although the oxide layer 2 in FIG. 15B is shown to be of reduced thickness in the area overlying the flared channels 4 and 9 respectively, it is not necessary to do so since operation of the device does not depend on the induced channel formation.

It is, of course, obvious that in any of the flared configurations described, the position $L_1$ at which the flaring begins to be generated in the plan view of either FIG. 14A or 15A is a matter of choice. The flaring may commence at the source and spread outward toward the drains or may commence at a point further along the length of the channels at a position $L_1$. For the reasons discussed above by which the width of the channels controls the eventual channel current further downstream toward the drains, it is most preferred to construct the devices with the flaring commencing after an initial distance $L_1$ which may be in the range of at least 1/10 to approximately ½ or more of the total channel length along the channel from the source toward the drains.

Having thus described the invention with relation to several preferred embodiments thereof, it will now be interesting to compare the typical filamentary form of a Vinhall device with some of the known prior art devices.

The filamentary form of the Vinhall device is defined by the ratio of Vinhall width $W_V$ to the total channel width W. Eq. (25) will be the starting point for this analysis. In Eq. (25) the width of the depletion zone inside a channel at one wall of the channel is described with relation to several variables. Assuming the most optimum values for the variables as follows:

$e_S = 1.04 \times 10^{-12}$
$q = 1.6 \times 10^{-19}$
$N_A = N_D = 10^{17}$ and
$\phi$ (as defined in connection with Eq. (24)) $= 4 \times 10^{-1}$ for these assumptions.

With the foregoing assumptions, the width of the depletion layer $l_n$ near the source in a Vinhall device [at which the V term for Eq. (25) is zero] is approximately 510 Å. The total depleted area is twice this value or approximately 1000 Å and, assuming the worst case, i.e., a wide channel Vinhall device, with a channel width W of 0.2 mil or 50,000 Å, the ratio $W_V$ divided by W is equal to 0.98. If a more appropriate total channel width of 0.1 mil, i.e., 25,000 Å is chosen, the ratio becomes 0.96.

The foregoing assumes the worst case for a Vinhall device in terms of width and the best case in terms of depletion zone widths that can be imagined. By comparison, taking some known prior art devices at their best possible conditions yields the following:

Consider a typical Hall device of the smallest dimensions contemplated, (approximately 1 mil square). The Vinhall width to channel width ratio in the vicinity of the source is approximately 0.999. Making the Hall device wider or longer will only serve to force the ratio closer to 1.0 since the depletion zone width as defined in Eq. (25) is not a function of channel width.

Considering the nature of the prior art device in the IBM TDB, Volumn 13, No. 12, May 1971, page 3633, and taking its teaching in light of the best known physical dimensions under which it could be constructed yields a Vinhall width to channel width ratio in the vicinity of the source which is near unity.

Having thus described the invention and given several examples of its mode of operation together with an explanation of its theory of operation with regard to several preferred embodiments thereof, it will be understood by those of skill in the art that many departures from the specific dimensions and technology utilized in constructing the preferred embodiments may occur without violating the basic teachings and principles of the invention as described.

Having thus described my invention, what I claim as new, and desire to secure by Letters Patent is:

1. In a semiconductive, channel conduction, field sensor device having a substrate of semiconductive material, a source region and at least two separated drain regions in said substrate, the improvement comprising:
   at least two first conductive channels in said substrate connecting said source and said drains, there being one said drain connected to each said channel;
   said first channels of conducting material each have a filamentary form defined by having a Vinhall width to channel width ratio in the vicinity of said source that is greater than 0 and less than 0.98; and
   a Lorentz voltage generating conductive channel in said substrate between said two first conductive channels and electrically coupling said two first channels together for applying a Lorentz voltage thereto in a direction at right angles to the flow of carriers in said two first channels.

2. In a device as described in claim 1, the improvement further comprising:
   a separate load resistance connected to each said drain in series with a source of voltage; and
   the distance between said source and said drains divided by said Vinhall width is greater than the value defined by the load resistance multiplied by the channel carrier density and by the channel carrier mobility and the electron unit charge in said two first channels.

3. In a device as described in claims 1 or 2, the improvement further comprising:
   the ratio of the Vinhall width of each said first channels in the vicinity of said drains to the Vinhall width of each of said first channels at said source is greater than 1.

4. In a device as described in claim 1, the improvement further comprising:
   the ratio of the Vinhall width of each of said first channels at a point along each of said first channels intermediate said source and said drains to the Vinhall width of each of said first channels at said drains is greater than 1; and
   the ratio of said width at said intermediate point along said first channels to said Vinhall width at said source is equal to one.

5. In a device as described in claims 1 or 2 or 3 or 4, the improvement further comprising:
   said separation between said drains is less than said Vinhall width.

6. In a device as described in claims 1 or 2 or 3 or 4 or 5, the improvement further comprising:
   said drains have a dimension taken parallel to the center of said channels which is less than equal to the distance separating said drains from one another.

7. In a device as described in claims 1 or 2 or 3 or 4 or 5 or 6, the improvement further comprising:
   said two first channels lying beneath the surface of said substrate and being separated therefrom by a layer of material of opposite conductivity to said two first channels and being separated from the surface of said substrate by a distance which is less than said Vinhall width.

8. In a device as described in claims 1 or 2 or 3 or 4 or 5 or 6 or 7, the improvement further comprising:
   the Vinhall width of each of said two first channels is greater than the thickness of each of said two first channels in the direction perpendicular to the surface of said substrate.

9. In a device as described in claims 1 or 2 or 3 or 4 or 5 or 6 or 7 or 8, the improvement further comprising:

voltage means applied between said source and said drains having sufficient magnitude to create pinch off of said two first conductive channels in the vicinity of said drains.

10. In a device as described in claims 1 or 2 or 3 or 4 or 5 or 6 or 7 or 8 or 9, the improvement further comprising:
the ratio of the width of said Lorentz voltage channel in the vicinity of said drains to the width of said channel at said source is greater than 1.

11. In a device as described in claims 1 or 2 or 3 or 4 or 5 or 6 or 7 or 8 or 9, the improvement further comprising:
the ratio of the width of said Lorentz voltage channel at a point thereon intermediate said source and said drains to the width of said channel at said source is 1; and
the ratio of said width of said channel at said intermediate point to the width of said channel in the vicinity of said drains is less than 1.

* * * * *